United States Patent
Mase et al.

(10) Patent No.: US 12,529,795 B2
(45) Date of Patent: *Jan. 20, 2026

(54) RANGING IMAGE SENSOR AND METHOD FOR MANUFACTURING SAME

(71) Applicant: HAMAMATSU PHOTONICS K.K., Hamamatsu (JP)

(72) Inventors: Mitsuhito Mase, Hamamatsu (JP); Jun Hiramitsu, Hamamatsu (JP); Akihiro Shimada, Hamamatsu (JP); Hiroaki Ishii, Hamamatsu (JP); Toshinori Ito, Hamamatsu (JP); Yuma Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 829 days.

This patent is subject to a terminal disclaimer.

(21) Appl. No.: 17/788,005

(22) PCT Filed: Dec. 7, 2020

(86) PCT No.: PCT/JP2020/045535
§ 371 (c)(1),
(2) Date: Jun. 22, 2022

(87) PCT Pub. No.: WO2021/131651
PCT Pub. Date: Jul. 1, 2021

(65) Prior Publication Data
US 2023/0026004 A1 Jan. 26, 2023

(30) Foreign Application Priority Data

Dec. 26, 2019 (JP) .................................. 2019-236237

(51) Int. Cl.
*G01S 17/89* (2020.01)
*H10F 39/00* (2025.01)

(52) U.S. Cl.
CPC ............ *G01S 17/89* (2013.01); *H10F 39/014* (2025.01); *H10F 39/8033* (2025.01); *H10F 39/807* (2025.01); *H10F 39/811* (2025.01)

(58) Field of Classification Search
None
See application file for complete search history.

(56) References Cited

U.S. PATENT DOCUMENTS 6,084,259 A * 7/2000 Kwon ................... H10F 39/803
257/292
8,120,079 B2 * 2/2012 Augusto ............... H10F 30/225
257/466

(Continued)

FOREIGN PATENT DOCUMENTS

CN 107949913 B 4/2019
EP 2040308 B1 * 4/2016 ............. H10F 99/00

(Continued)

OTHER PUBLICATIONS

JP 6913793 Translation (Year: 2021).*
International Preliminary Report on Patentability mailed Jul. 7, 2022 for PCT/JP2020/045535.

*Primary Examiner* — Shawn Decenzo
(74) *Attorney, Agent, or Firm* — Faegre Drinker Biddle & Reath LLP

(57) ABSTRACT

A ranging image sensor includes a semiconductor layer and an electrode layer. The semiconductor layer and the electrode layer form a plurality of pixels. Each of the plurality of pixels includes an avalanche multiplication region, a charge distribution region, a first charge transfer region, and a second charge transfer region in the semiconductor layer. Each of the plurality of pixels includes a photogate electrode, a first transfer gate electrode, and a second transfer gate electrode in the electrode layer. The avalanche multiplication region is continuous over the plurality of pixels or (Continued)

reaches a trench formed in the semiconductor layer so as to separate the plurality of pixels from each other.

11 Claims, 22 Drawing Sheets

(56) References Cited

U.S. PATENT DOCUMENTS

| | | | |
|---|---|---|---|
| 2005/0012167 A1* | 1/2005 | Sawase | H10F 39/014 257/414 |
| 2006/0151783 A1* | 7/2006 | Otani | H10F 39/18 257/E27.151 |
| 2010/0187501 A1 | 7/2010 | Toda | |
| 2011/0024606 A1* | 2/2011 | Suzuki | H10F 39/158 250/208.1 |
| 2011/0073923 A1* | 3/2011 | Tatani | H10F 39/813 438/59 |
| 2013/0001651 A1* | 1/2013 | Mase | H10F 39/807 257/225 |
| 2016/0255295 A1* | 9/2016 | Fereyre | H10F 39/813 348/302 |
| 2017/0192090 A1 | 7/2017 | Roy et al. | |
| 2019/0187260 A1 | 6/2019 | Van Der Tempel | |
| 2020/0335546 A1* | 10/2020 | Miura | H10F 39/802 |
| 2023/0048727 A1* | 2/2023 | Mase | G01S 17/894 |
| 2023/0223418 A1* | 7/2023 | Hiramitsu | H10F 39/803 257/431 |

FOREIGN PATENT DOCUMENTS

| | | | | |
|---|---|---|---|---|
| JP | 2009-014460 A | 1/2009 | | |
| JP | 2009-047661 A | 3/2009 | | |
| JP | 2011-133464 A | 7/2011 | | |
| JP | 2011-222893 A | 11/2011 | | |
| JP | 2013-206903 A | 10/2013 | | |
| JP | 2018-530176 A | 10/2018 | | |
| JP | 2018157156 A | 10/2018 | | |
| JP | 2019-004149 A | 1/2019 | | |
| JP | 2019-079968 A | 5/2019 | | |
| JP | 2019169643 A | 10/2019 | | |
| JP | 6913793 B1 * | 8/2021 | | H10F 30/225 |
| KR | 20180136717 A | 12/2018 | | |
| WO | WO-2008/004547 A1 | 1/2008 | | |
| WO | WO-2017/004663 A1 | 1/2017 | | |
| WO | WO-2018174090 A1 * | 9/2018 | | H04N 25/70 |
| WO | WO-2021/131651 A1 | 7/2021 | | |

* cited by examiner

Fig.5
(a) 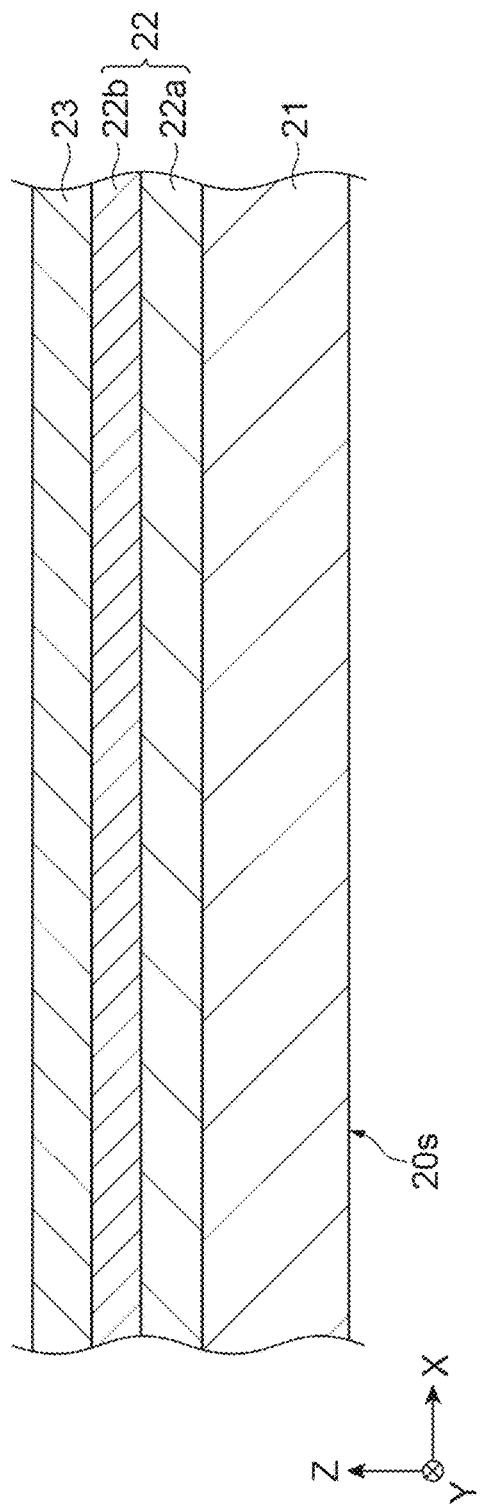
(b) 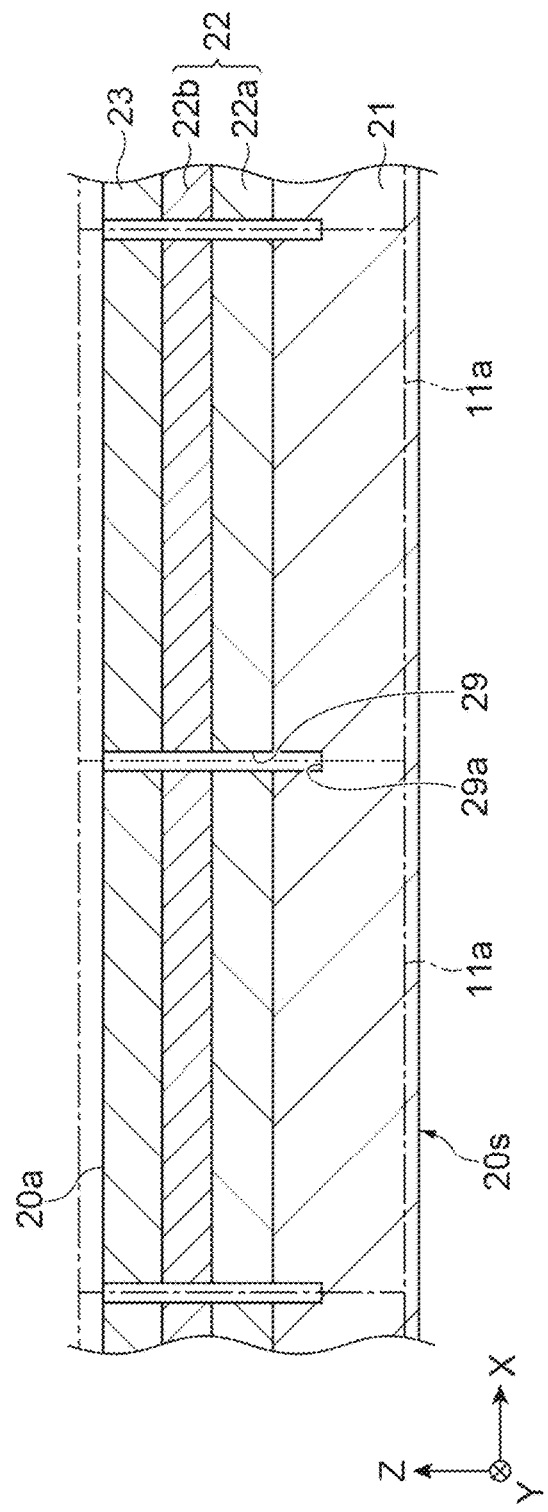

RANGING IMAGE SENSOR AND METHOD FOR MANUFACTURING SAME

TECHNICAL FIELD

The present disclosure relates to a ranging image sensor and a method for manufacturing the same.

BACKGROUND ART

As a ranging image sensor that acquires a distance image of an object by using an indirect TOF (Time of Flight) method, a ranging image sensor is known that includes a semiconductor layer in which a photosensitive region is provided and a photogate electrode and a transfer gate electrode provided on the semiconductor layer for each pixel (see, for example, Patent Literatures 1 and 2). According to such a ranging image sensor, the charge generated in the photosensitive region due to the incidence of light can be transferred at high speed.

CITATION LIST

Patent Literature

Patent Literature 1: Japanese Unexamined Patent Publication No. 2011-133464
Patent Literature 2: Japanese Unexamined Patent Publication No. 2013-206903

SUMMARY OF INVENTION

Technical Problem

In the ranging image sensor described above, for example, in order to increase the distance that can be measured, it may be required to improve the light receiving sensitivity.

It is an object of the present disclosure to provide a ranging image sensor capable of improving the light receiving sensitivity uniformly in a plurality of pixels and a method for manufacturing the same.

Solution to Problem

A ranging image sensor according to an aspect of the present disclosure includes: a semiconductor layer having a first surface on a first side and a second surface on a second side opposite to the first side and forming a plurality of pixels arranged along the first surface; and an electrode layer provided on the first surface and forms the plurality of pixels. Each of the plurality of pixels includes: an avalanche multiplication region including a first conductive type first multiplication region formed in the semiconductor layer and a second conductive type second multiplication region formed on the first side of the first multiplication region in the semiconductor layer; a second conductive type charge distribution region formed on the first side of the second multiplication region in the semiconductor layer and connected to the second multiplication region; a second conductive type first charge transfer region formed on the first side of the second multiplication region in the semiconductor layer and connected to the charge distribution region; a second conductive type second charge transfer region formed on the first side of the second multiplication region in the semiconductor layer and connected to the charge distribution region; a photogate electrode formed on the first side of the charge distribution region in the electrode layer; a first transfer gate electrode formed on the first side of the charge distribution region in the electrode layer so as to be located on the first charge transfer region side with respect to the photogate electrode; and a second transfer gate electrode formed on the first side of the charge distribution region in the electrode layer so as to be located on the second charge transfer region side with respect to the photogate electrode. The avalanche multiplication region is continuous over the plurality of pixels or reaches a trench formed in the semiconductor layer so as to separate the plurality of pixels from each other.

In the ranging image sensor, the avalanche multiplication region formed in the semiconductor layer is continuous over the plurality of pixels or reaches the trench formed in the semiconductor layer so as to separate the plurality of pixels from each other. As a result, high sensitivity is realized in each of the plurality of pixels in a state in which the variation in the light receiving sensitivity between the plurality of pixels and the variation in the light receiving sensitivity according to the location in one pixel are suppressed. Therefore, according to the ranging image sensor, it is possible to improve the light receiving sensitivity uniformly in a plurality of pixels.

In the ranging image sensor according to an aspect of the present disclosure, the trench may be formed on the first surface, and a bottom surface of the trench may be located on the second side with respect to the avalanche multiplication region. Therefore, it is possible to suppress the occurrence of crosstalk between adjacent pixels.

In the ranging image sensor according to an aspect of the present disclosure, the trench may be formed on the first surface, and a bottom surface of the trench may be located in the avalanche multiplication region. Therefore, it is possible to sufficiently suppress the occurrence of crosstalk between adjacent pixels while shortening the time for forming the trench.

In the ranging image sensor according to an aspect of the present disclosure, each of the plurality of pixels may further include: a first conductive type well region formed on the first side of the second multiplication region in the semiconductor layer and forming a read circuit electrically connected to at least one of the first charge transfer region and the second charge transfer region; and a second conductive type barrier region formed between the second multiplication region and the well region in the semiconductor layer. Therefore, even if a depletion layer formed in the avalanche multiplication region spreads toward the first conductive type well region by applying a high voltage to the avalanche multiplication region, the second conductive type barrier region suppresses the depletion layer from reaching the first conductive type well region. That is, it is possible to suppress the current from flowing between the avalanche multiplication region and the well region due to the depletion layer reaching the well region.

In the ranging image sensor according to an aspect of the present disclosure, the barrier region may include the well region when viewed from a thickness direction of the semiconductor layer. Therefore, it is possible to suppress the current from flowing between the avalanche multiplication region and the well region due to the depletion layer reaching the well region.

In the ranging image sensor according to an aspect of the present disclosure, each of the plurality of pixels may further include a second conductive type sink region formed on the first side of the barrier region in the semiconductor layer and connected to the barrier region. Therefore, since the electrons collected around the second conductive type barrier region are drawn into the second conductive type sink region, it is possible to suppress the electrons collected around the barrier region from becoming noise as parasitic electrons.

In the ranging image sensor according to an aspect of the present disclosure, the sink region may be connected to the second charge transfer region. Therefore, when the second charge transfer region is used as an unnecessary charge discharge region, the charge drawn into the sink region can be discharged to the second charge transfer region.

The ranging image sensor according to an aspect of the present disclosure may further include a wiring layer provided on the first surface so as to cover the electrode layer and electrically connected to each of the plurality of pixels. Therefore, the input and output of the electric signal to and from each of the plurality of pixels can be performed through the wiring layer.

A method for manufacturing a ranging image sensor according to an aspect of the present disclosure is a method for manufacturing the ranging image sensor above-described, and includes: a first step of forming the semiconductor layer by forming the avalanche multiplication region, the charge distribution region, the first charge transfer region, and the second charge transfer region on a semiconductor substrate; and a second step of forming the electrode layer by forming the photogate electrode, the first transfer gate electrode, and the second transfer gate electrode on the first surface of the semiconductor layer after the first step. In the first step, the avalanche multiplication region is formed on the semiconductor substrate so as to be continuous over the plurality of pixels.

In the method for manufacturing a ranging image sensor, the avalanche multiplication region is formed on the semiconductor substrate so as to be continuous over the plurality of pixels. As a result, in the manufactured ranging image sensor, high sensitivity is realized in each of the plurality of pixels in a state in which the variation in the light receiving sensitivity between the plurality of pixels and the variation in the light receiving sensitivity according to the location in one pixel are suppressed. Therefore, according to the method for manufacturing the ranging image sensor, it is possible to obtain the ranging image sensor in which the light receiving sensitivity is improved uniformly in the plurality of pixels.

In the method for manufacturing a ranging image sensor according to an aspect of the present disclosure, in the first step, the trench may be formed on the first surface after at least the avalanche multiplication region is formed on the semiconductor substrate. Therefore, it is possible to easily and reliably obtain a configuration in which the avalanche multiplication region reaches the trench.

The method for manufacturing a ranging image sensor according to an aspect of the present disclosure may further include: a fifth step of forming a wiring layer on the first surface so as to cover the electrode layer and electrically connecting the wiring layer to each of the plurality of pixels after the second step. Therefore, in the manufactured ranging image sensor, the input and output of the electric signal to and from each of the plurality of pixels can be performed through the wiring layer.

Advantageous Effects of Invention

According to the present disclosure, it is possible to provide a ranging image sensor capable of improving the light receiving sensitivity uniformly in a plurality of pixels and a method for manufacturing the same.

BRIEF DESCRIPTION OF DRAWINGS

FIG. 5 is a cross-sectional view for explaining a method for manufacturing the ranging image sensor according to the first embodiment.

DESCRIPTION OF EMBODIMENTS

Figure 1:
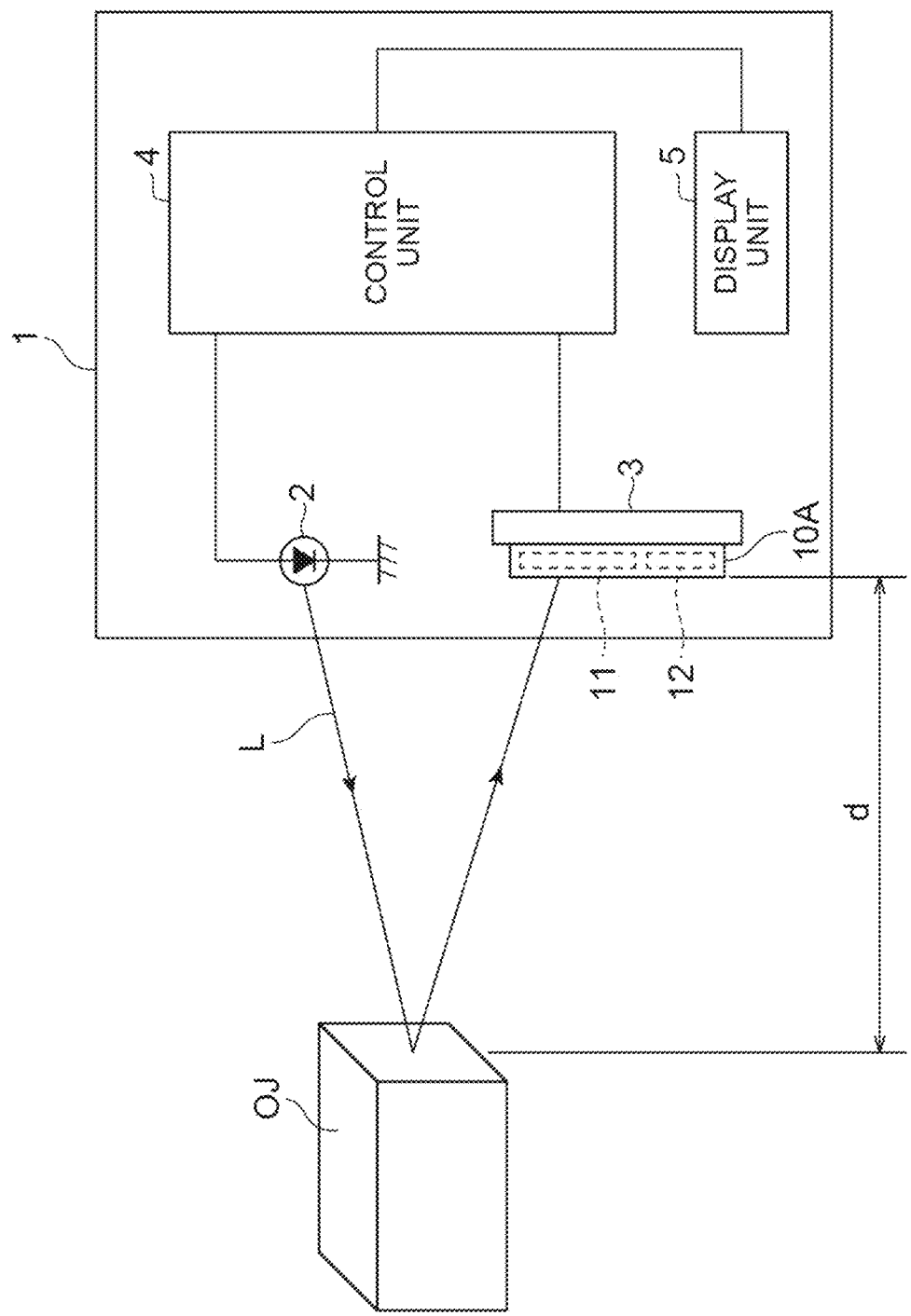
FIG. 1 is a configuration diagram of a photodetector including a ranging image sensor according to a first embodiment.

Hereinafter, embodiments of the present disclosure will be described in detail with reference to the diagrams. In addition, the same or equivalent portions in the diagrams are denoted by the same reference numerals, and repeated description thereof will be omitted.

First embodiment

[Configuration of Photodetector]

As shown in FIG. 1, a photodetector 1 includes a light source 2, a ranging image sensor 10A, a signal processing unit 3, a control unit 4, and a display unit 5. The photodetector 1 is a device that acquires a distance image of an object OJ (an image including information regarding a distance d to the object OJ) by using an indirect TOF method.

The light source 2 emits pulsed light L. The light source 2 is, for example, an infrared LED and the like. The pulsed light L is, for example, near-infrared light, and the frequency of the pulsed light L is, for example, 10 kHz or higher. The ranging image sensor 10A detects the pulsed light L emitted from the light source 2 and reflected by the object OJ. The ranging image sensor 10A is configured by monolithically forming a pixel unit 11 and a CMOS read circuit unit 12 on a semiconductor substrate (for example, a silicon substrate). The ranging image sensor 10A is mounted on the signal processing unit 3.

The signal processing unit 3 controls the pixel unit 11 and the CMOS read circuit unit 12 of the ranging image sensor 10A. The signal processing unit 3 performs predetermined processing on the signal output from the ranging image sensor 10A to generate a detection signal. The control unit 4 controls the light source 2 and the signal processing unit 3. The control unit 4 generates a distance image of the object OJ based on the detection signal output from the signal processing unit 3. The display unit 5 displays the distance image of the object OJ generated by the control unit 4.

[Configuration of Ranging Image Sensor]

Figure 2:
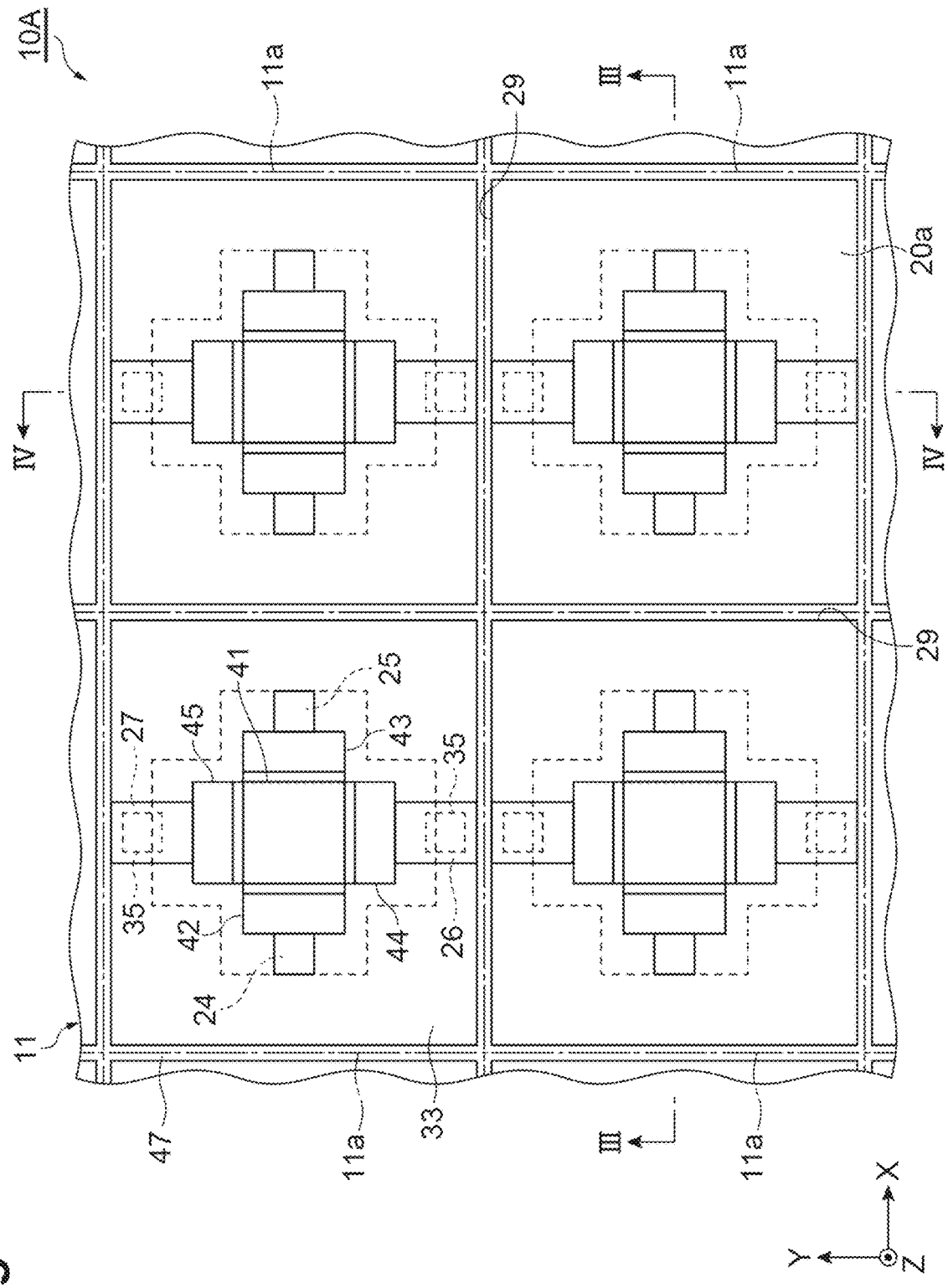
FIG. 2 is a plan view of a pixel unit of the ranging image sensor according to the first embodiment.
Figure 3:
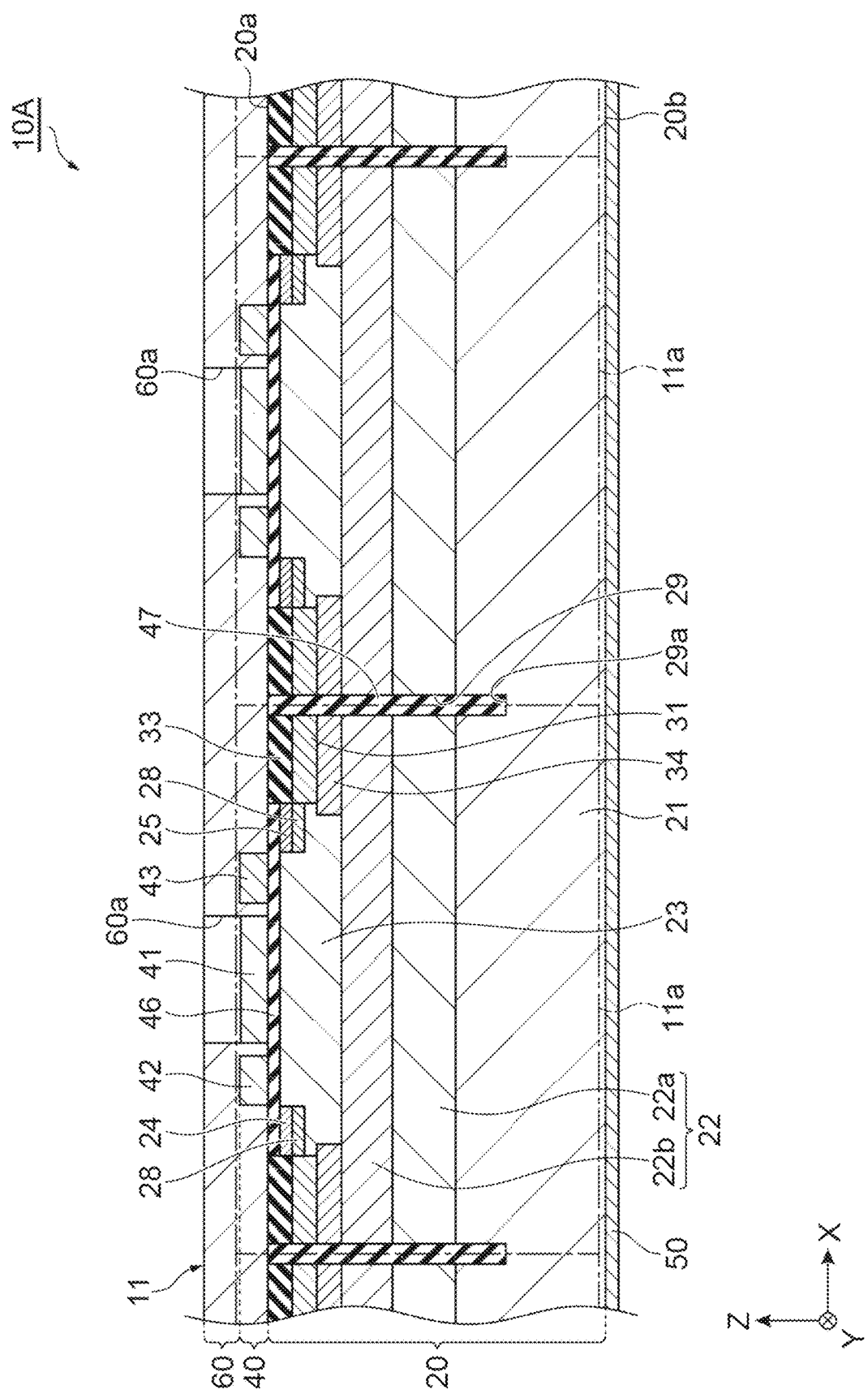
FIG. 3 is a cross-sectional view taken along the line III-III shown in FIG. 2.
Figure 4:
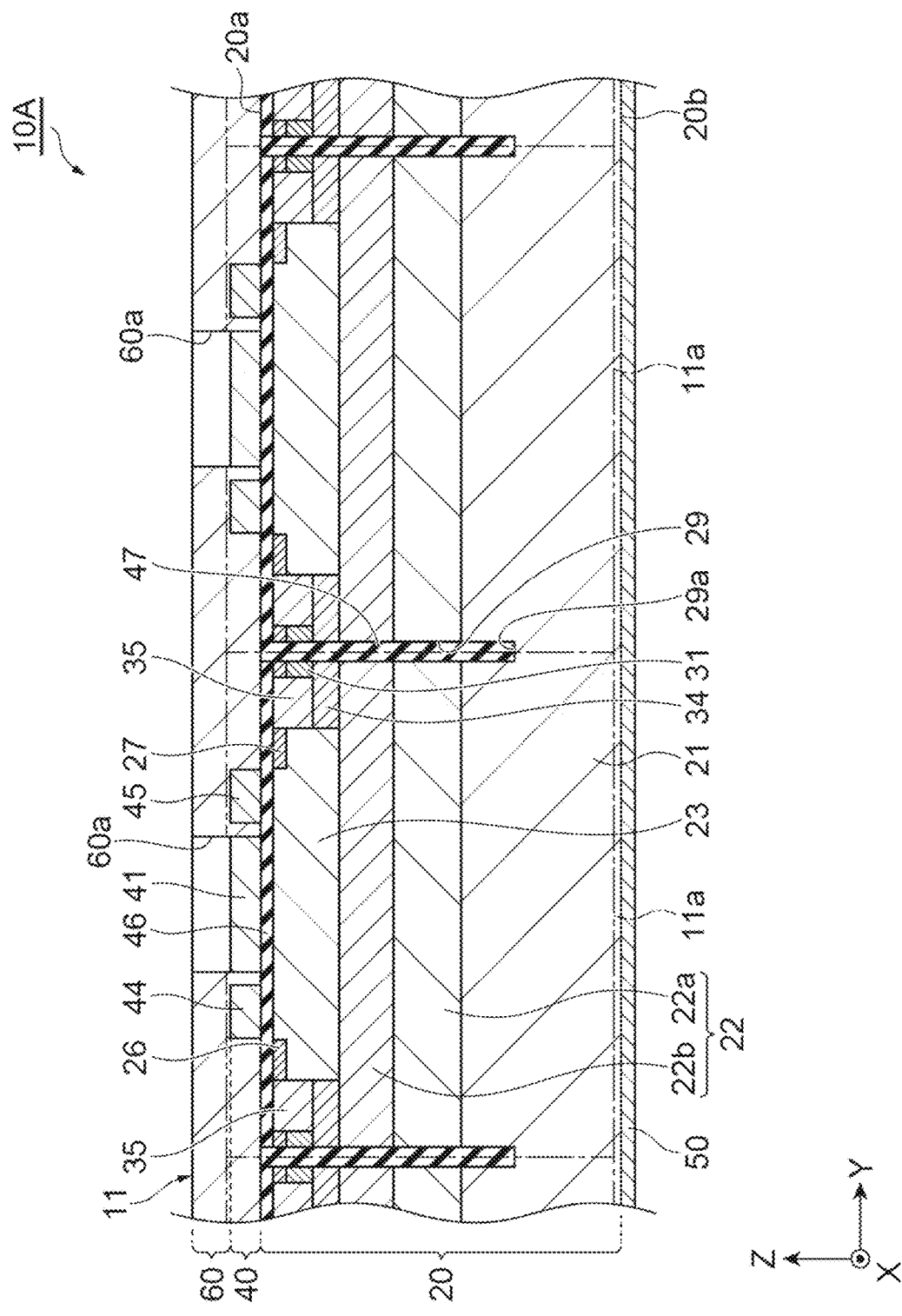
FIG. 4 is a cross-sectional view taken along the line IV-IV shown in FIG. 2.

As shown in FIGS. 2, 3, and 4, the ranging image sensor 10A includes a semiconductor layer 20 and an electrode layer 40 in the pixel unit 11. The semiconductor layer 20 has a first surface 20a and a second surface 20b. The first surface 20a is a surface on one side of the semiconductor layer 20 in the thickness direction. The second surface 20b is a surface on the other side of the semiconductor layer 20 in the thickness direction. The electrode layer 40 is provided on the first surface 20a of the semiconductor layer 20. The semiconductor layer 20 and the electrode layer 40 form a plurality of pixels 11a arranged along the first surface 20a. In the ranging image sensor 10A, the plurality of pixels 11a are aligned in a two-dimensional manner along the first surface 20a. Hereinafter, the thickness direction of the semiconductor layer 20 is referred to as a Z direction, one direction perpendicular to the Z direction is referred to as an X direction, and a direction perpendicular to both the Z direction and the X direction is referred to as a Y direction. In addition, one side in the Z direction is referred to as a first side, and the other side in the Z direction (side opposite to the first side) is referred to as a second side. In addition, in FIG. 2, the illustration of a wiring layer 60, which will be described later, is omitted.

In the semiconductor layer 20, each pixel 11a includes a semiconductor region 21, an avalanche multiplication region 22, a charge distribution region 23, a pair of first charge transfer regions 24 and 25, a pair of second charge transfer regions 26 and 27, a plurality of charge blocking regions 28, a well region 31, a LOCOS (Local Oxidation of Silicon) region 33, a barrier region 34, and a pair of sink regions 35. Each of the regions 21 to 28 and 31 to 35 is formed by performing various processes (for example, etching, film formation, impurity injection, and the like) on a semiconductor substrate (for example, a silicon substrate).

The semiconductor region 21 is a p-type (first conductive type) region, and is provided along the second surface 20b in the semiconductor layer 20. The semiconductor region 21 functions as a light absorption region (photoelectric conversion region). As an example, the semiconductor region 21 is a p-type region having a carrier concentration of $1 \times 10^{15}$ $cm^{-3}$ or less, and the thickness of the semiconductor region 21 is about 10 μm. In addition, the avalanche multiplication region 22 and the like also function as a light absorption region (photoelectric conversion region).

The avalanche multiplication region 22 includes a first multiplication region 22a and a second multiplication region 22b. The first multiplication region 22a is a p-type region, and is formed on the first side of the semiconductor region 21 in the semiconductor layer 20. As an example, the first multiplication region 22a is a p-type region having a carrier concentration of $1 \times 10^{16}$ $cm^{-3}$ or more, and the thickness of the first multiplication region 22a is about 1 μm. The second multiplication region 22b is an n-type (second conductive type) region, and is formed on the first side of the first multiplication region 22a in the semiconductor layer 20. As an example, the second multiplication region 22b is an n-type region having a carrier concentration of $1 \times 10^{16}$ $cm^{-3}$ or more, and the thickness of the second multiplication region 22b is about 1 μm. The first multiplication region 22a and the second multiplication region 22b form a pn junction.

The charge distribution region 23 is an n-type region, and is formed on the first side of the second multiplication region 22b in the semiconductor layer 20. As an example, the charge distribution region 23 is an n-type region having a carrier concentration of $5 \times 10^{15}$ to $1 \times 10^{16}$ $cm^{-3}$, and the thickness of the charge distribution region 23 is about 1 μm.

Each of the first charge transfer regions 24 and 25 is an n-type region, and is formed on the first side of the second multiplication region 22b in the semiconductor layer 20. Each of the first charge transfer regions 24 and 25 is connected to the charge distribution region 23. The pair of first charge transfer regions 24 and 25 face each other in the X direction with a portion of the charge distribution region 23 on the first side interposed therebetween. As an example, each of the first charge transfer regions 24 and 25 is an n-type region having a carrier concentration of $1 \times 10^{18}$ $cm^{-3}$ or more, and the thickness of each of the first charge transfer regions 24 and 25 is about 0.2 μm. In addition, a portion of the charge distribution region 23 on the second side is interposed between each of the first charge transfer regions 24 and 25 and the second multiplication region 22b. In the present embodiment, each of the first charge transfer regions 24 and 25 functions as a charge storage region.

Each of the second charge transfer regions 26 and 27 is an n-type region, and is formed on the first side of the second multiplication region 22b in the semiconductor layer 20. Each of the second charge transfer regions 26 and 27 is connected to the charge distribution region 23. The pair of second charge transfer regions 26 and 27 face each other in the Y direction with a portion of the charge distribution region 23 on the first side interposed therebetween. As an example, each of the second charge transfer regions 26 and 27 is an n-type region having a carrier concentration of $1 \times 10^{18}$ $cm^{-3}$ or more, and the thickness of each of the second charge transfer regions 26 and 27 is about 0.2 μm. In addition, a portion of the charge distribution region 23 on the second side is interposed between each of the second charge transfer regions 26 and 27 and the second multiplication region 22b. In the present embodiment, each of the second charge transfer regions 26 and 27 functions as a charge discharge region.

Each charge blocking region 28 is a p-type region, and is formed between each of the first charge transfer regions 24 and 25 and the charge distribution region 23 (a portion of the charge distribution region 23 on the second side) in the semiconductor layer 20. As an example, each charge blocking region 28 is a p-type region having a carrier concentration of $1 \times 10^{17}$ to $1 \times 10^{18}$ cm$^{-3}$, and the thickness of each charge blocking region 28 is about 0.2 μm.

The well region 31 is a p-type region, and is formed on the first side of the second multiplication region 22b in the semiconductor layer 20. The well region 31 surrounds the charge distribution region 23 when viewed from the Z direction. The LOCOS region 33 is formed on the first side of the well region 31 in the semiconductor layer 20. The LOCOS region 33 is connected to the well region 31. The well region 31 forms a plurality of read circuits (for example, a source follower amplifier and a reset transistor) together with the LOCOS region 33. Each read circuit is electrically connected to each of the first charge transfer regions 24 and 25. As an example, the well region 31 is a p-type region having a carrier concentration of $1 \times 10^{16}$ to $5 \times 10^{17}$ cm$^{-3}$, and the thickness of the well region 31 is about 1 μm. In addition, as a structure for electrically separating the pixel unit and the read circuit unit from each other, STI (Shallow Trench Isolation) may be used instead of the LOCOS region 33, or only the well region 31 may be used.

The barrier region 34 is an n-type region, and is formed between the second multiplication region 22b and the well region 31 in the semiconductor layer 20. The barrier region 34 includes the well region 31 when viewed from the Z direction. That is, the well region 31 is located in the barrier region 34 when viewed from the Z direction. The barrier region 34 surrounds the charge distribution region 23. The concentration of n-type impurities in the barrier region 34 is higher than the concentration of n-type impurities in the second multiplication region 22b. As an example, the barrier region 34 is an n-type region having a carrier concentration from the carrier concentration of the second multiplication region 22b to about twice the carrier concentration of the second multiplication region 22b, and the thickness of the barrier region 34 is about 1 μm.

Each sink region 35 is an n-type region, and is formed on the first side of the barrier region 34 in the semiconductor layer 20. The end of each sink region 35 on the second side is connected to the barrier region 34. The end of each sink region 35 on the first side is connected to each of the second charge transfer regions 26 and 27.

The concentration of n-type impurities in each of the second charge transfer regions 26 and 27 is higher than the concentration of n-type impurities in each sink region 35, and the concentration of n-type impurities in each sink region 35 is higher than the concentration of n-type impurities in the barrier region 34 and the concentration of p-type impurities in the well region 31. As an example, each sink region 35 is an n-type region having a carrier concentration equal to or higher than the carrier concentration of the well region 31, and the thickness of each sink region 35 depends on the distance between each of the second charge transfer regions 26 and 27 and the barrier region 34.

Each pixel 11a includes a photogate electrode 41, a pair of first transfer gate electrodes 42 and 43, and a pair of second transfer gate electrodes 44 and 45 in the electrode layer 40. Each of the gate electrodes 41 to 45 is formed on the first surface 20a of the semiconductor layer 20 with an insulating film 46 interposed therebetween. The insulating film 46 is, for example, a silicon nitride film, a silicon oxide film, or the like.

The photogate electrode 41 is formed on the first side of the charge distribution region 23 in the electrode layer 40. The photogate electrode 41 is formed of a material having conductivity and light transmission (for example, polysilicon). As an example, the photogate electrode 41 has a rectangular shape having two sides facing each other in the X direction and two sides facing each other in the Y direction when viewed from the Z direction.

The first transfer gate electrode 42 is formed on the first side of the charge distribution region 23 in the electrode layer 40 so as to be located on the first charge transfer region 24 side with respect to the photogate electrode 41. The first transfer gate electrode 43 is formed on the first side of the charge distribution region 23 in the electrode layer 40 so as to be located on the first charge transfer region 25 side with respect to the photogate electrode 41. Each of the first transfer gate electrodes 42 and 43 is formed of a material having conductivity and light transmission (for example, polysilicon). As an example, each of the first transfer gate electrodes 42 and 43 has a rectangular shape having two sides facing each other in the X direction and two sides facing each other in the Y direction when viewed from the Z direction.

The second transfer gate electrode 44 is formed on the first side of the charge distribution region 23 in the electrode layer 40 so as to be located on the second charge transfer region 26 side with respect to the photogate electrode 41. The second transfer gate electrode 45 is formed on the first side of the charge distribution region 23 in the electrode layer 40 so as to be located on the second charge transfer region 27 side with respect to the photogate electrode 41. Each of the second transfer gate electrodes 44 and 45 is formed of a material having conductivity and light transmission (for example, polysilicon). As an example, each of the second transfer gate electrodes 44 and 45 has a rectangular shape having two sides facing each other in the X direction and two sides facing each other in the Y direction when viewed from the Z direction.

The ranging image sensor 10A further includes a counter electrode 50 and the wiring layer 60 in the pixel unit 11. The counter electrode 50 is provided on the second surface 20b of the semiconductor layer 20. The counter electrode 50 includes a plurality of pixels 11a when viewed from the Z direction. The counter electrode 50 faces the electrode layer 40 in the Z direction. The counter electrode 50 is formed of, for example, a metal material. The wiring layer 60 is provided on the first surface 20a of the semiconductor layer 20 so as to cover the electrode layer 40. The wiring layer 60 is electrically connected to each pixel 11a and the CMOS read circuit unit 12 (see FIG. 1). A light incidence opening 60a is formed in a portion of the wiring layer 60 facing the photogate electrode 41 of each pixel 11a.

A trench 29 is formed in the semiconductor layer 20 so as to separate the pixels 11a from each other. The trench 29 is formed on the first surface 20a of the semiconductor layer 20. A bottom surface 29a of the trench 29 is located on the second side with respect to the avalanche multiplication region 22. That is, the trench 29 completely separates the avalanche multiplication region 22. An insulating material 47, such as silicon oxide, is arranged in the trench 29. In addition, instead of the insulating material 47, a metal material such as tungsten, polysilicon, or the like may be arranged in the trench 29.

In each pixel 11a, the avalanche multiplication region 22 reaches the trench 29. The avalanche multiplication region 22 is a region that causes avalanche multiplication. That is, in each pixel 11a, the avalanche multiplication region 22 where an electric field strength of $3 \times 10^5$ to $4 \times 10^5$ V/cm can be generated when a predetermined value of reverse bias is applied extends over the entire region surrounded by the trench 29.

An example of the operation of the ranging image sensor 10A configured as described above is as follows. In each pixel 11a of the ranging image sensor 10A, a negative voltage (for example, −50 V) is applied to the counter electrode 50 with the electric potential of the photogate electrode 41 as a reference (that is, a reverse bias is applied to the pn junction formed in the avalanche multiplication region 22), so that an electric field strength of $3 \times 10^5$ to $4 \times 10^5$ V/cm is generated in the avalanche multiplication region 22. In this state, when the pulsed light L is incident on the semiconductor layer 20 through the light incidence opening 60a and the photogate electrode 41, electrons generated by the absorption of the pulsed light L are multiplied in the avalanche multiplication region 22 and move to the charge distribution region 23 at high speed.

When generating a distance image of the object OJ (see FIG. 1), a reset voltage is applied to the pair of second transfer gate electrodes 44 and 45 in each pixel 11a. The reset voltage is a positive voltage with respect to the electric potential of the photogate electrode 41. Therefore, the electrons that have moved to the charge distribution region 23 are discharged from the pair of second charge transfer regions 26 and 27.

Then, a pulse voltage signal is applied to the pair of first transfer gate electrodes 42 and 43. As an example, the pulse voltage signal applied to the first transfer gate electrode 42 is a voltage signal in which a positive voltage and a negative voltage are alternately repeated with the electric potential of the photogate electrode 41 as a reference, and is a voltage signal having the same period, pulse width, and phase as the intensity signal of the pulsed light L emitted from the light source 2 (see FIG. 1). On the other hand, the pulse voltage signal applied to the first transfer gate electrode 43 is the same voltage signal as the pulse voltage signal applied to the first transfer gate electrode 42 except that the phase is shifted by 180°.

Therefore, the electrons that have moved to the charge distribution region 23 are alternately transferred to the pair of first charge transfer regions 24 and 25 at high speed. The electrons stored in each of the first charge transfer regions 24 and 25 by the transfer for a predetermined period are transferred to the CMOS read circuit unit 12 (see FIG. 1) as a signal through a read circuit configured by the well regions 31 and the like and the wiring layer 60.

As shown in FIG. 1, when the pulsed light L is emitted from the light source 2 and the pulsed light L reflected by the object OJ is detected by the ranging image sensor 10A, the phase of the intensity signal of the pulsed light L detected by the ranging image sensor 10A is shifted from the phase of the intensity signal of the pulsed light L emitted from the light source 2 according to the distance d to the object OJ. Therefore, by acquiring a signal based on the electrons stored in each of the first charge transfer regions 24 and 25 for each pixel 11a, it is possible to generate a distance image of the object OJ.

[Method for Manufacturing Ranging Image Sensor]

As shown in (a) of FIG. 5, a p-type semiconductor substrate 20s is prepared, and the avalanche multiplication region 22 and the charge distribution region 23 are formed on the semiconductor substrate 20s. At this time, the avalanche multiplication region 22 is formed on the semiconductor substrate 20s so as to be continuous over the plurality of pixels 11a (see (b) of FIG. 5). Then, as shown in (b) of FIG. 5, the trench 29 is formed on the first surface 20a of the semiconductor layer 20. Then, as shown in (a) of FIG. 6, each of the regions 24 to 28 and 31 to 35 is formed on the semiconductor substrate 20s so that each pixel 11a includes a pair of first charge transfer regions 24 and 25, a pair of second charge transfer regions 26 and 27, a plurality of charge blocking regions 28, the well regions 31, the LOCOS region 33, the barrier region 34, and a pair of sink regions 35. As described above, the semiconductor layer 20 is formed in which the trench 29 is formed (first step). In addition, the semiconductor region 21 is a region of the semiconductor substrate 20s.

Figure 6:
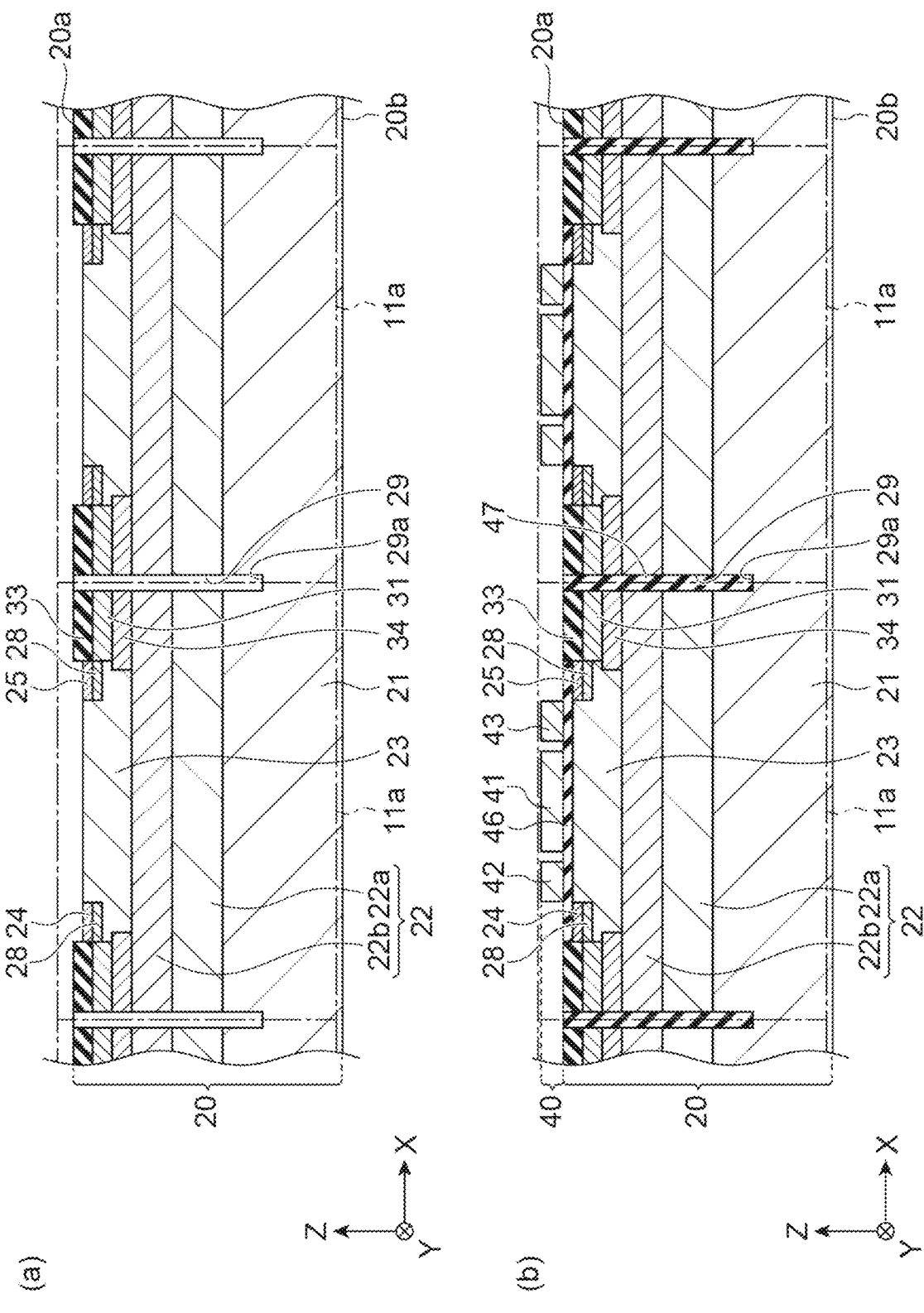
FIG. 6 is a cross-sectional view for explaining a method for manufacturing the ranging image sensor according to the first embodiment.

Then, as shown in (b) of FIG. 6, each of the gate electrodes 41 to 45 is formed on the first surface 20a of the semiconductor layer 20 so that each pixel 11a includes the photogate electrode 41, a pair of first transfer gate electrodes 42 and 43, and a pair of second transfer gate electrodes 44 and 45. As a result, the electrode layer 40 is formed (second step). Then, as shown in FIG. 3, the wiring layer 60 is formed on the first surface 20a of the semiconductor layer 20 so as to cover the electrode layer 40, and the wiring layer 60 is electrically connected to each pixel 11a (third step). Then, the counter electrode 50 is formed on the second surface 20b of the semiconductor layer 20. In parallel with the formation of the pixel unit 11 on the semiconductor substrate 20s, the CMOS read circuit unit 12 is formed on the semiconductor substrate 20s. As described above, the ranging image sensor 10A is manufactured. In addition, the trench 29 may be formed before each of the gate electrodes 41 to 45 is formed on the first surface 20a of the semiconductor layer 20 after each of the regions 24 to 28 and 31 to 35 is formed on the semiconductor substrate 20s.

[Operations and Effects]

In the ranging image sensor 10A, the avalanche multiplication region 22 formed in the semiconductor layer 20 reaches the trench 29 formed in the semiconductor layer 20 so as to separate the pixels 11a from each other. As a result, high sensitivity is realized in each pixel 11a in a state in which the variation in the light receiving sensitivity between the plurality of pixels 11a and the variation in the light receiving sensitivity according to the location in one pixel 11a are suppressed. Therefore, according to the ranging image sensor 10A, it is possible to improve the light receiving sensitivity uniformly in a plurality of pixels 11a.

In the ranging image sensor 10A, the bottom surface 29a of the trench 29 is located on the second side with respect to the avalanche multiplication region 22. As a result, it is possible to suppress the occurrence of crosstalk between adjacent pixels 11a.

In the ranging image sensor 10A, the n-type barrier region 34 is formed between the n-type second multiplication region 22b and the p-type well region 31 that forms a read circuit. Therefore, even if a depletion layer formed in the avalanche multiplication region 22 spreads toward the p-type well region 31 by applying a high voltage to the avalanche multiplication region 22, the n-type barrier region 34 suppresses the depletion layer from reaching the p-type well region 31. That is, it is possible to suppress the current from flowing between the avalanche multiplication region 22 and the well region 31 due to the depletion layer reaching the well region 31.

In the ranging image sensor 10A, the barrier region 34 includes the well region 31 when viewed from the Z direction. As a result, it is possible to suppress the current from flowing between the avalanche multiplication region 22 and the well region 31 due to the depletion layer reaching the well region 31.

In the ranging image sensor 10A, the n-type sink region 35 connected to the barrier region 34 is formed on the first side of the barrier region 34. Therefore, since the electrons collected around the n-type barrier region 34 are drawn into the n-type sink region 35, it is possible to suppress the electrons collected around the barrier region 34 from becoming noise as parasitic electrons. In addition, by adjusting the impurity concentration in a region between the first charge transfer region 24 and each sink region 35 and a region between the first charge transfer region 25 and each sink region 35, it is possible to form a potential energy state in which parasitic electrons are more likely to be drawn into the sink region 35 than each of the first charge transfer regions 24 and 25.

In the ranging image sensor 10A, the sink region 35 is connected to each of the second charge transfer regions 26 and 27. Therefore, the parasitic electrons drawn into the sink region 35 can be discharged to each of the second charge transfer regions 26 and 27, which function as unnecessary charge discharge regions.

In the ranging image sensor 10A, the wiring layer 60 is provided on the first surface 20a of the semiconductor layer 20 so as to cover the electrode layer 40, and the wiring layer 60 is electrically connected to each pixel 11a. As a result, the input and output of the electric signal to and from each pixel 11a can be performed through the wiring layer 60.

In the method for manufacturing the ranging image sensor 10A, the avalanche multiplication region 22 is formed on the semiconductor substrate 20s so as to be continuous over the plurality of pixels 11a. As a result, in the manufactured ranging image sensor 10A, high sensitivity is realized in each pixel 11a in a state in which the variation in the light receiving sensitivity between the plurality of pixels 11a and the variation in the light receiving sensitivity according to the location in one pixel 11a are suppressed. Therefore, according to the method for manufacturing the ranging image sensor 10A, it is possible to obtain the ranging image sensor 10A in which the light receiving sensitivity is improved uniformly in a plurality of pixels 11a.

In the method for manufacturing the ranging image sensor 10A, the trench 29 is formed on the first surface 20a of the semiconductor layer 20 after the avalanche multiplication region 22 is formed. As a result, it is possible to easily and reliably obtain a configuration in which the avalanche multiplication region 22 reaches the trench 29.

In the method for manufacturing the ranging image sensor 10A, after the gate electrodes 41 to 45 are formed, the wiring layer 60 is formed on the first surface 20a of the semiconductor layer 20 so as to cover the electrode layer 40, and the wiring layer 60 is electrically connected to each pixel 11a. As a result, in the manufactured ranging image sensor 10A, the input and output of the electric signal to and from each pixel 11a can be performed through the wiring layer 60.

Second Embodiment

Figure 7:
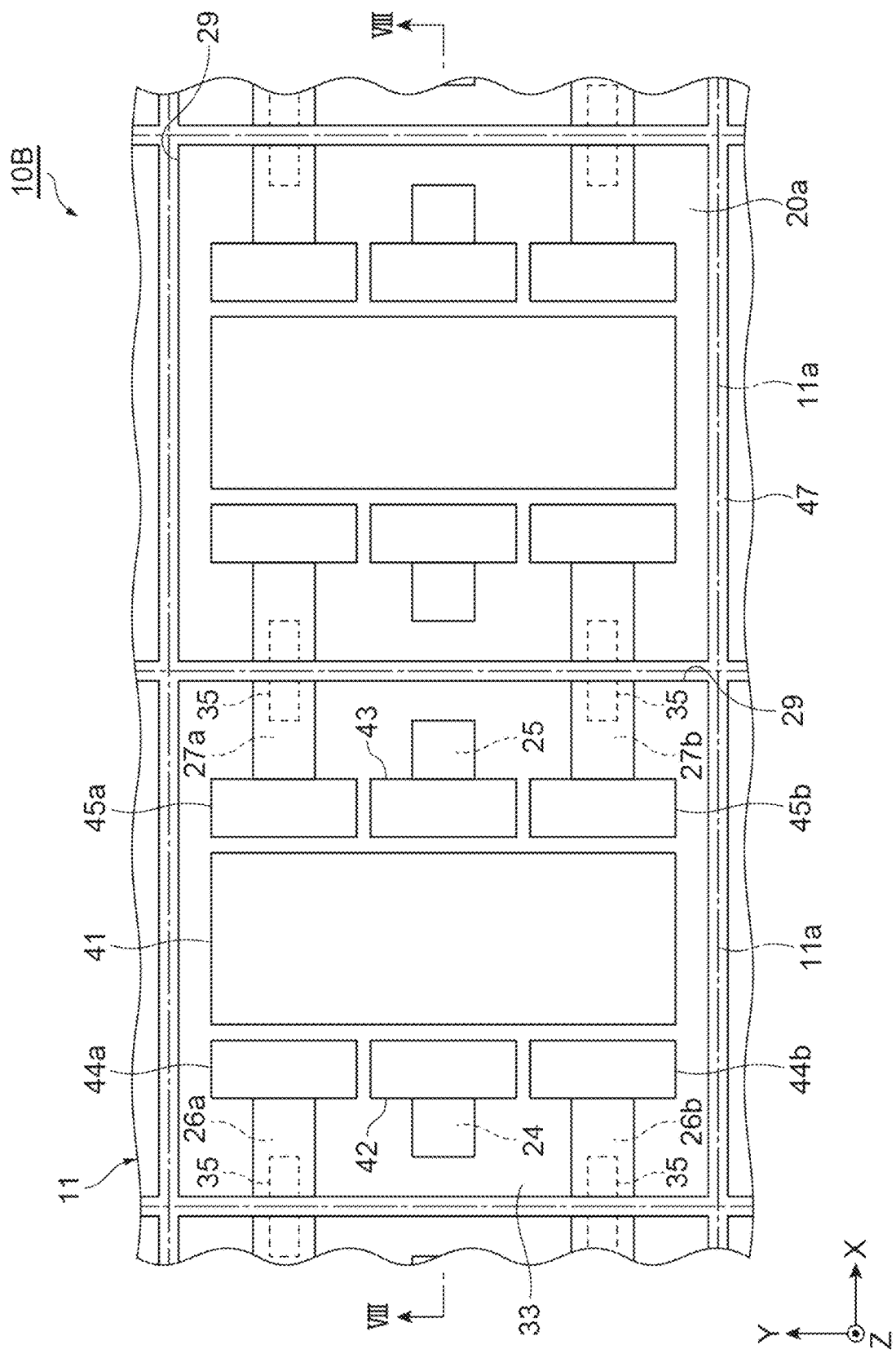
FIG. 7 is a plan view of a part of a ranging image sensor according to a second embodiment.
Figure 8:
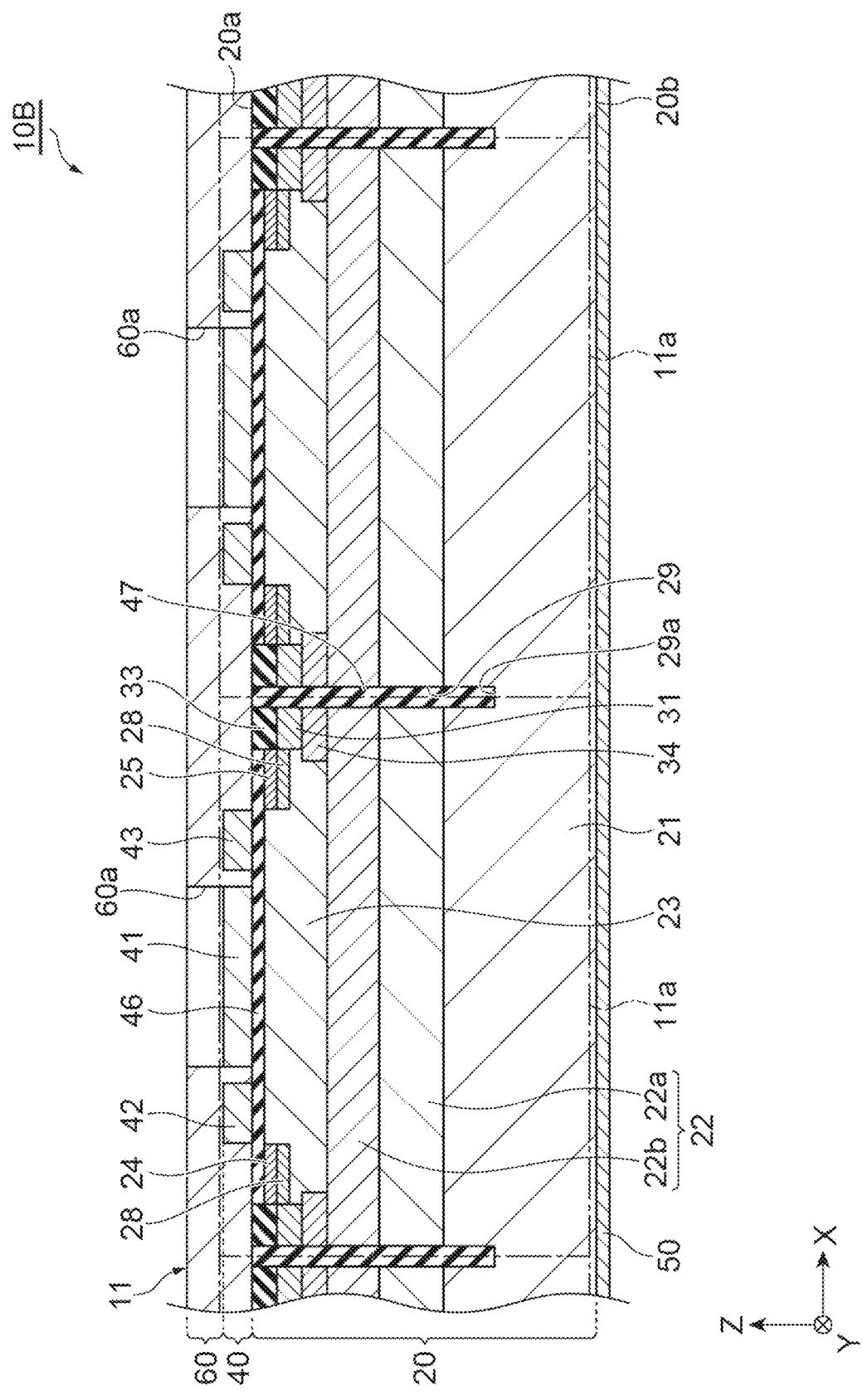
FIG. 8 is a cross-sectional view taken along the line VIII-VIII shown in FIG. 7.

As shown in FIGS. 7 and 8, a ranging image sensor 10B is mainly different from the above-described ranging image sensor 10A in that second charge transfer regions 26a, 26b, 27a, and 27b are arranged on both sides of the charge distribution region 23 in the X direction and a plurality of second transfer gate electrodes 44a, 44b, 45a, and 45b are arranged on both sides of the photogate electrode 41 in the X direction.

In each pixel 11a of the ranging image sensor 10B, a pair of second charge transfer regions 26a and 26b are arranged on one side of the charge distribution region 23 in the X direction and on both sides of the first charge transfer region 24 in the Y direction. A pair of second charge transfer regions 27a and 27b are arranged on the other side of the charge distribution region 23 in the X direction and on both sides of the first charge transfer region 25 in the Y direction. The second transfer gate electrode 44a is arranged between the photogate electrode 41 and the second charge transfer region 26a when viewed from the Z direction. The second transfer gate electrode 44b is arranged between the photogate electrode 41 and the second charge transfer region 26b when viewed from the Z direction. The second transfer gate electrode 45a is arranged between the photogate electrode 41 and the second charge transfer region 27a when viewed from the Z direction. The second transfer gate electrode 45b is arranged between the photogate electrode 41 and the second charge transfer region 27b when viewed from the Z direction.

Also in the ranging image sensor 10B, similarly to the ranging image sensor 10A described above, the avalanche multiplication region 22 formed in the semiconductor layer 20 reaches the trench 29 formed in the semiconductor layer 20 so as to separate the pixels 11a from each other. As a result, high sensitivity is realized in each pixel 11a in a state in which the variation in the light receiving sensitivity between the plurality of pixels 11a and the variation in the light receiving sensitivity according to the location in one pixel 11a are suppressed. Therefore, according to the ranging image sensor 10B, it is possible to improve the light receiving sensitivity uniformly in a plurality of pixels 11a.

Third Embodiment

Figure 9:
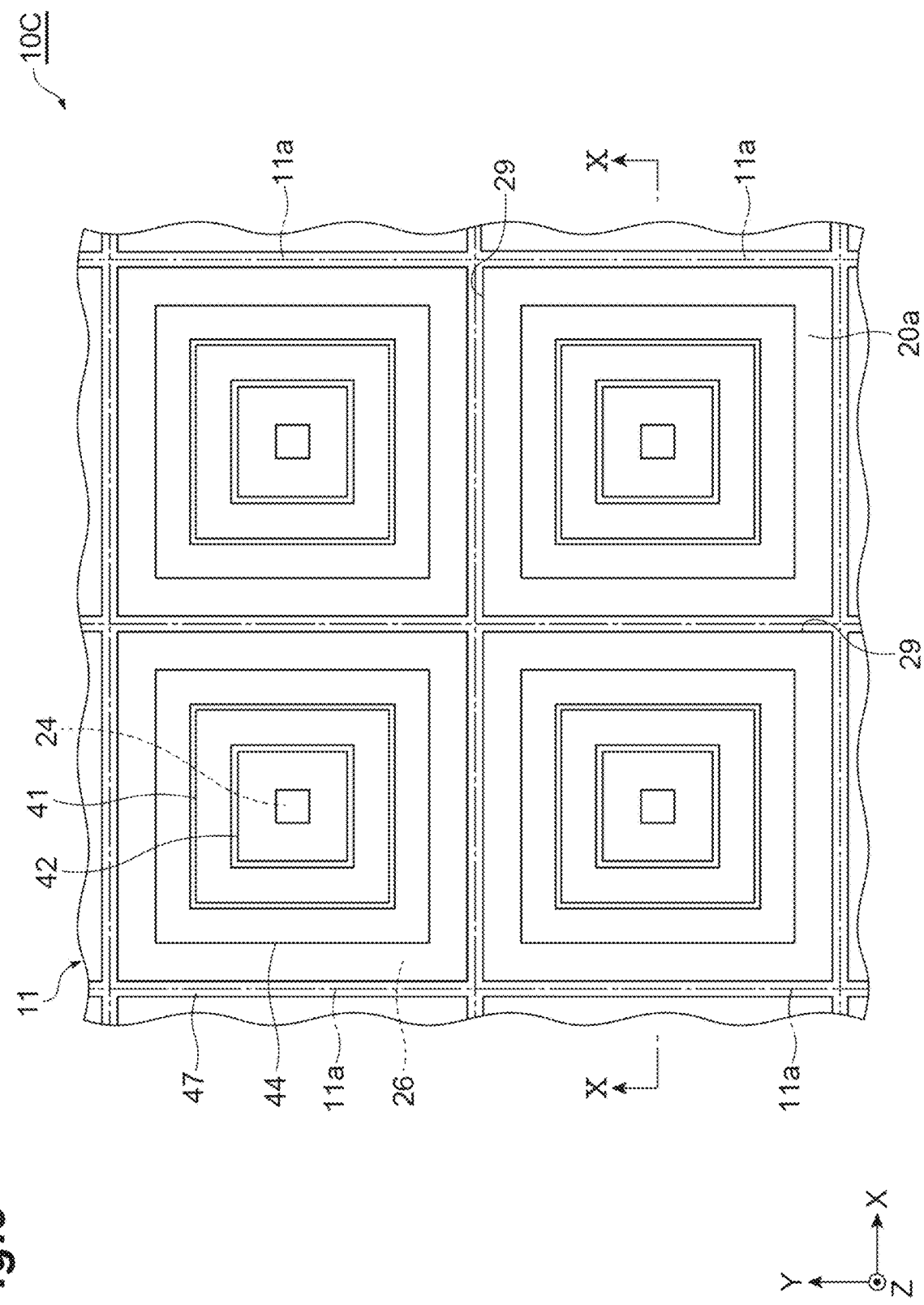
FIG. 9 is a plan view of a part of a ranging image sensor according to a third embodiment.
Figure 10:
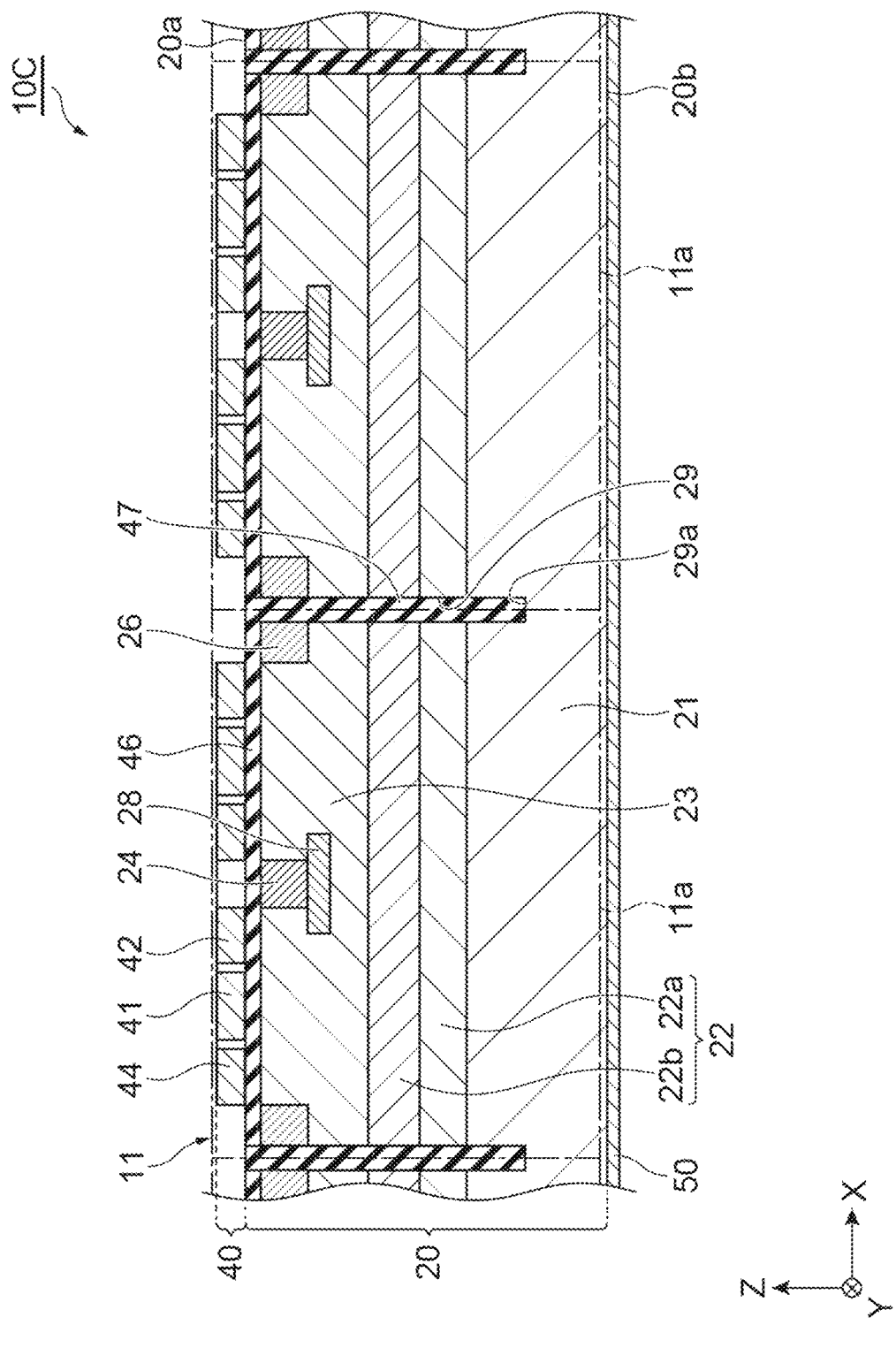
FIG. 10 is a cross-sectional view taken along the line X-X shown in FIG. 9.

As shown in FIGS. 9 and 10, a ranging image sensor 10C is mainly different from the above-described ranging image sensor 10A in that the first charge transfer region 24 is arranged in the central portion of the charge distribution region 23, the second charge transfer region 26 is formed in a ring shape, and each of the electrodes 41, 42, and 44 is formed in a ring shape.

In each pixel 11a of the ranging image sensor 10C, the first charge transfer region 24 is arranged in the central portion of the charge distribution region 23 when viewed from the Z direction. The second charge transfer region 26 has, for example, a rectangular ring shape and is arranged along the outer edge of the charge distribution region 23 when viewed from the Z direction. The photogate electrode 41 has, for example, a rectangular ring shape and is arranged outside the first charge transfer region 24 and inside the second charge transfer region 26 when viewed from the Z direction. The first transfer gate electrode 42 has, for example, a rectangular ring shape and is arranged outside the first charge transfer region 24 and inside the photogate electrode 41 when viewed from the Z direction. The second transfer gate electrode 44 has, for example, a rectangular ring shape and is arranged outside the photogate electrode 41 and inside the second charge transfer region 26 when viewed from the Z direction.

Also in the ranging image sensor 10C, similarly to the ranging image sensor 10A described above, the avalanche multiplication region 22 formed in the semiconductor layer 20 reaches the trench 29 formed in the semiconductor layer 20 so as to separate the pixels 11a from each other. As a result, high sensitivity is realized in each pixel 11a in a state in which the variation in the light receiving sensitivity between the plurality of pixels 11a and the variation in the light receiving sensitivity according to the location in one pixel 11a are suppressed. Therefore, according to the ranging image sensor 10C, it is possible to improve the light receiving sensitivity uniformly in a plurality of pixels 11a.

In addition, in the ranging image sensor 10C, the well region 31, the LOCOS region 33, the barrier region 34, and the sink region 35 (see FIG. 3) are not formed in the semiconductor layer 20. Therefore, according to the ranging image sensor 10C, it is possible to increase the density of the plurality of pixels 11a and simplify the structure of the semiconductor layer 20. As an example, a semiconductor substrate on which a read circuit for each pixel 11a and a CMOS read circuit unit 12 are formed is bonded to the ranging image sensor 10C from the first side.

Fourth Embodiment

Figure 11:
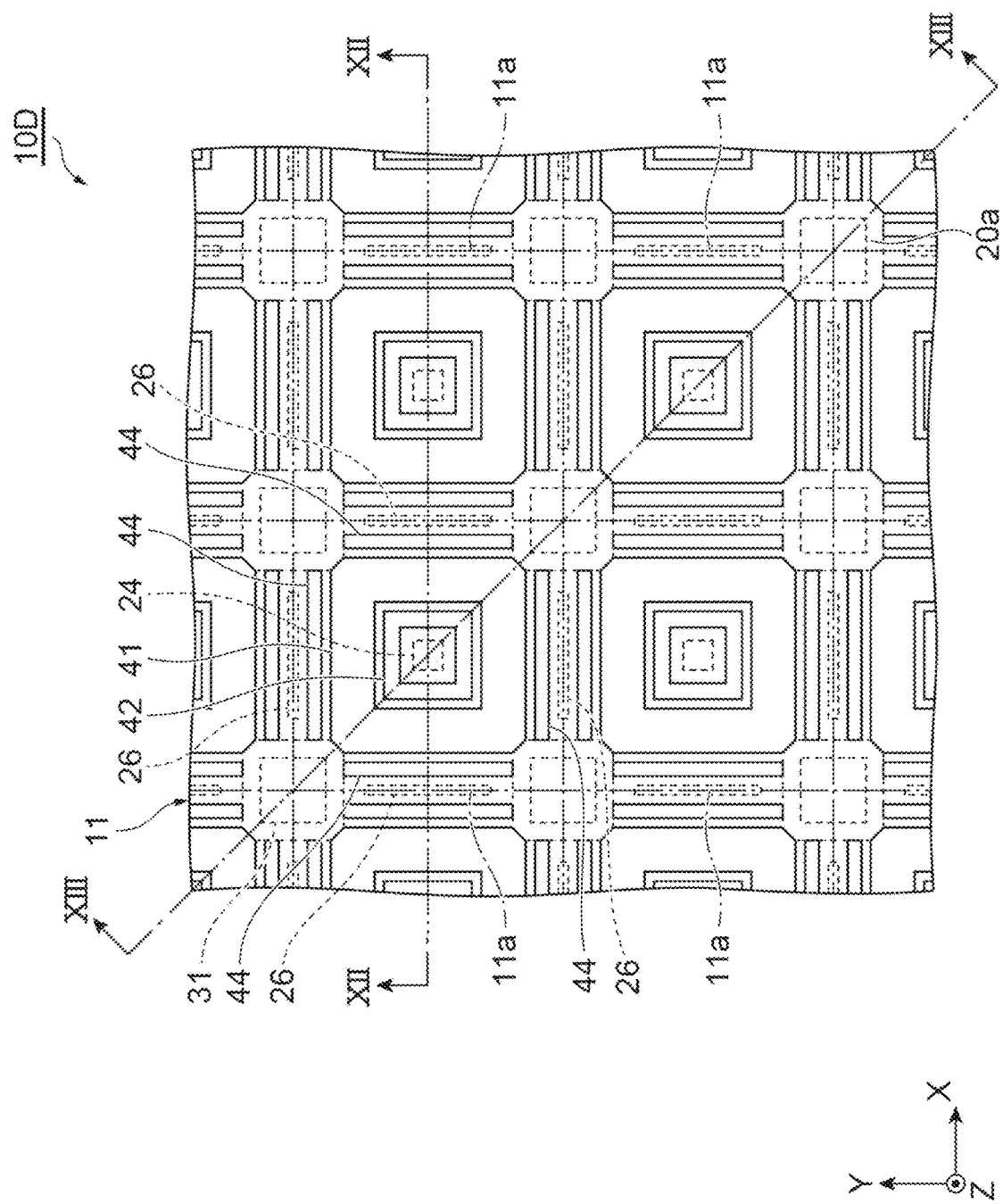
FIG. 11 is a plan view of a part of a ranging image sensor according to a fourth embodiment.
Figure 12:
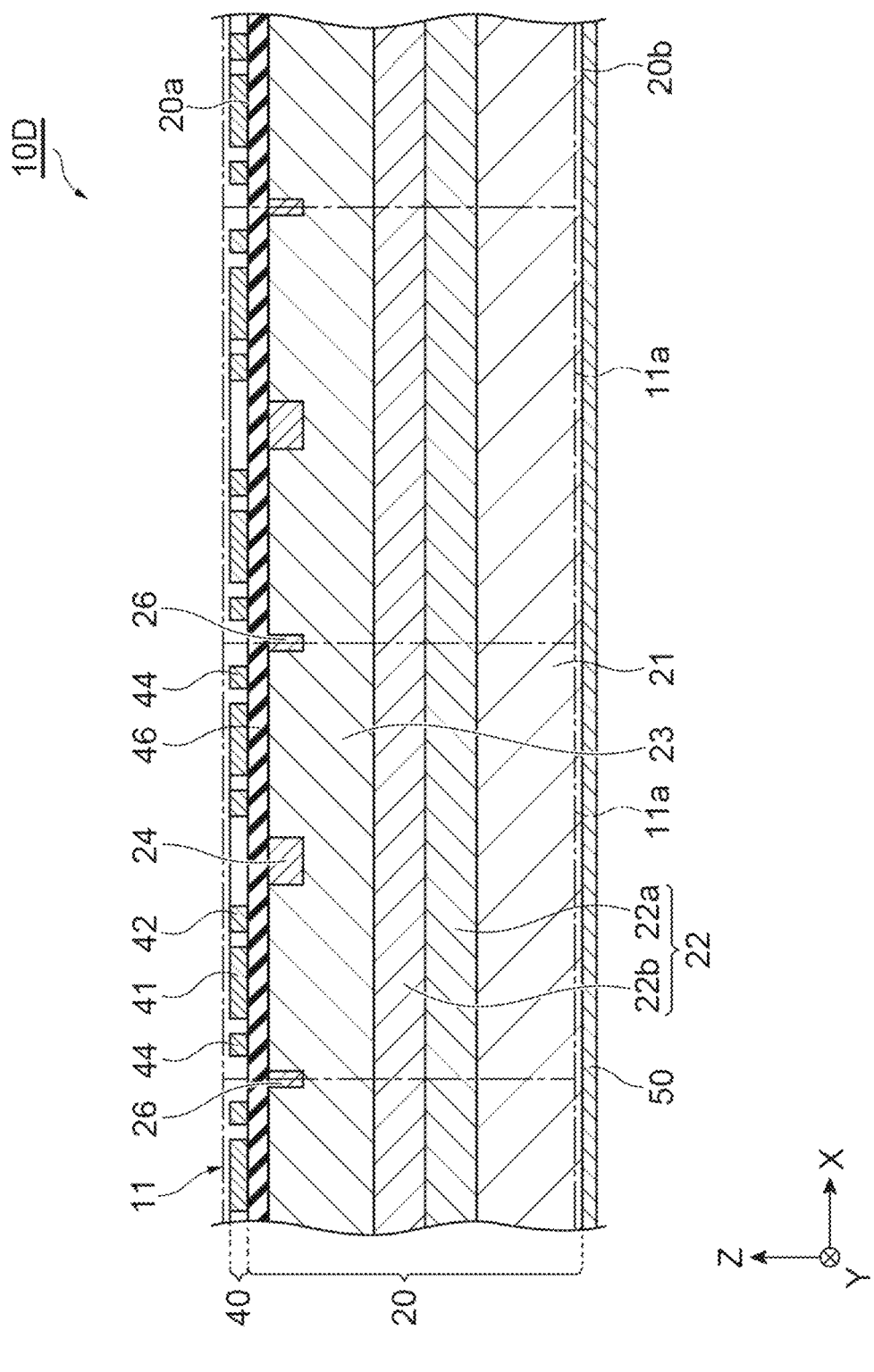
FIG. 12 is a cross-sectional view taken along the line XII-XII shown in FIG. 11.
Figure 13:
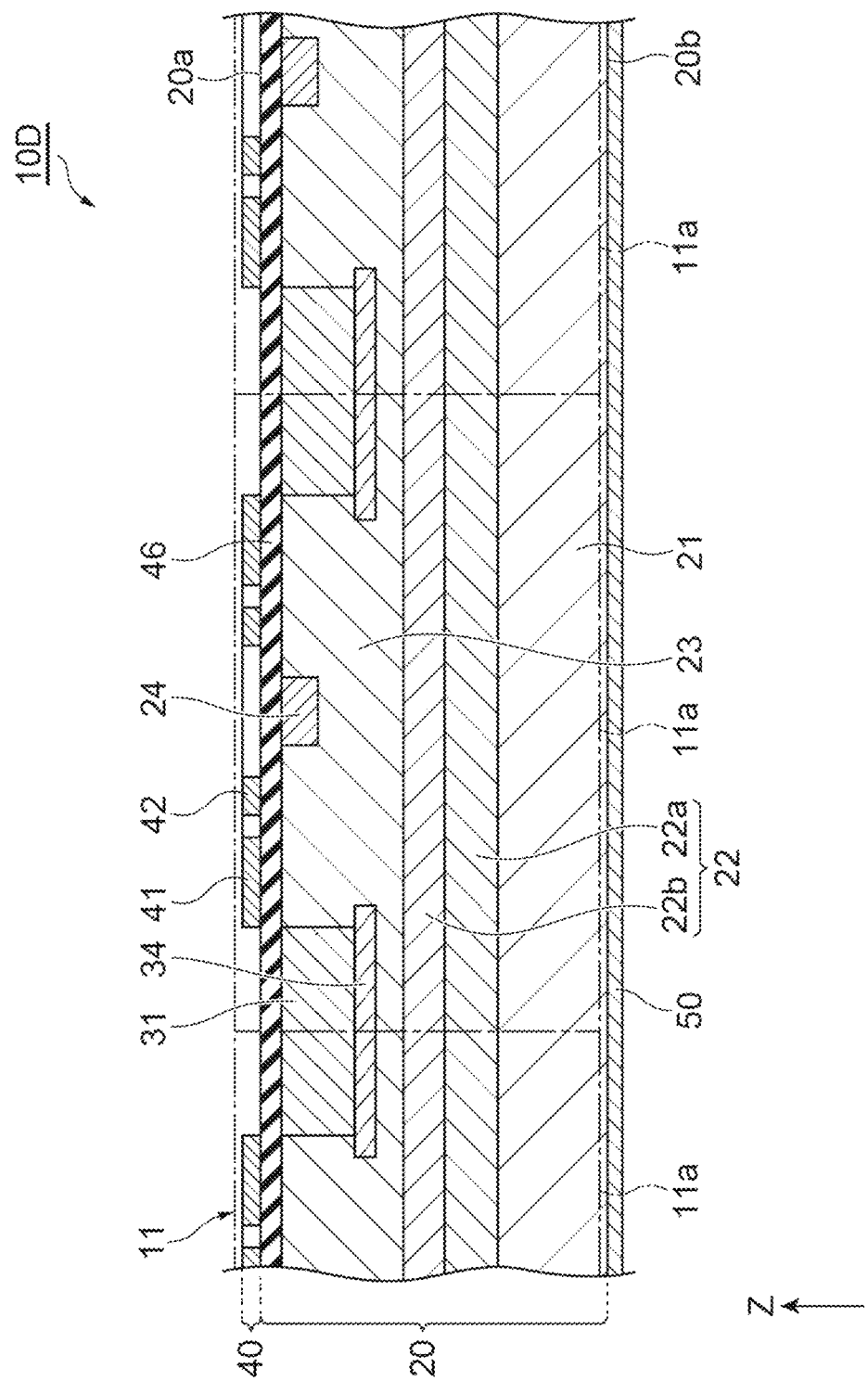
FIG. 13 is a cross-sectional view taken along the line XIII-XIII shown in FIG. 11.

As shown in FIGS. 11, 12, and 13, a ranging image sensor 10D is mainly different from the above-described ranging image sensor 10A in that the first charge transfer region 24 is arranged in the central portion of the charge distribution region 23, a plurality of second charge transfer regions 26 are arranged along the outer edge of the charge distribution region 23, the photogate electrode 41 and the first transfer gate electrode 42 are formed in a ring shape, a plurality of second transfer gate electrodes 44 are arranged so as to surround the photogate electrode 41, and the trench 29 is not formed in the semiconductor layer 20 and the avalanche multiplication region 22 is continuous over a plurality of pixels 11a.

In each pixel 11a of the ranging image sensor 10D, the first charge transfer region 24 is arranged in the central portion of the charge distribution region 23 when viewed from the Z direction. The plurality of second charge transfer regions 26 are arranged along the outer edge of the charge distribution region 23 when viewed from the Z direction. Each second charge transfer region 26 is shared by two adjacent pixels 11a. The photogate electrode 41 has, for example, a rectangular ring shape and is arranged outside the first charge transfer region 24 and inside the plurality of second charge transfer regions 26 when viewed from the Z direction. The first transfer gate electrode 42 has, for example, a rectangular ring shape and is arranged outside the first charge transfer region 24 and inside the photogate electrode 41 when viewed from the Z direction. Each second transfer gate electrode 44 is arranged between the photogate electrode 41 and each second charge transfer region 26 when viewed from the Z direction.

In each pixel 11a of the ranging image sensor 10D, the well region 31 and the barrier region 34 are arranged on the intersections of a plurality of virtual lines arranged in a grid pattern so as to partition the plurality of pixels 11a when viewed from the Z direction. For this reason, the trench 29 is not formed in the semiconductor layer 20, and the avalanche multiplication region 22 is continuous over the plurality of pixels 11a.

In the ranging image sensor 10D, the avalanche multiplication region 22 formed in the semiconductor layer 20 is continuous over the plurality of pixels 11a. As a result, high sensitivity is realized in each pixel 11a in a state in which the variation in the light receiving sensitivity between the plurality of pixels 11a and the variation in the light receiving sensitivity according to the location in one pixel 11a are suppressed. Therefore, according to the ranging image sensor 10D, it is possible to improve the light receiving sensitivity uniformly in a plurality of pixels 11a.

In addition, in the ranging image sensor 10D, the sink region 35 (see FIG. 3) is not formed in the semiconductor layer 20. This is because, in the ranging image sensor 10D, the barrier region 34 is separated from the first charge transfer region 24 as compared with the above-described ranging image sensor 10A, and as a result, the electrons collected around the barrier region 34 are difficult to enter the first charge transfer region 24.

Fifth Embodiment

Figure 14:
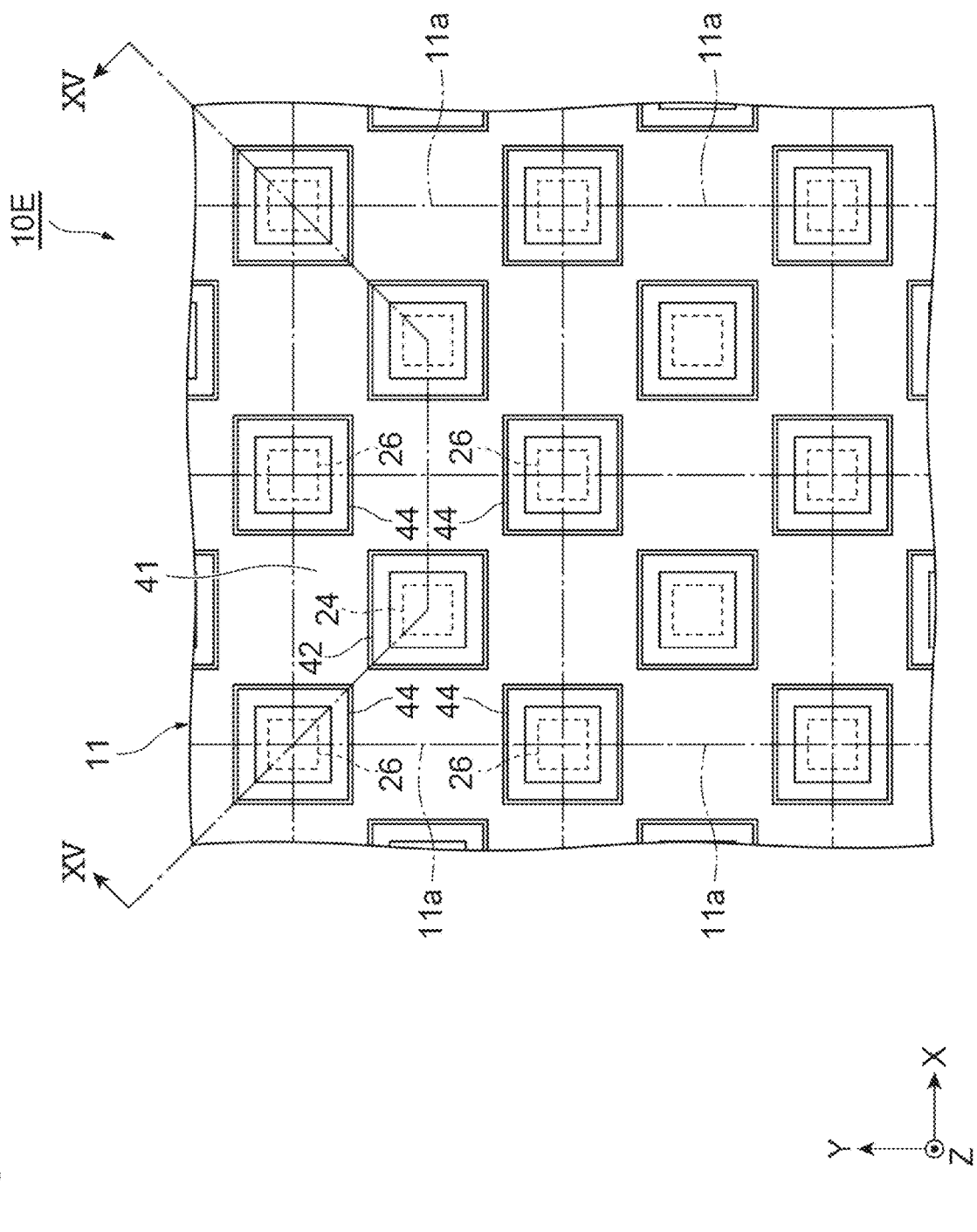
FIG. 14 is a plan view of a part of a ranging image sensor according to a fifth embodiment.
Figure 15:
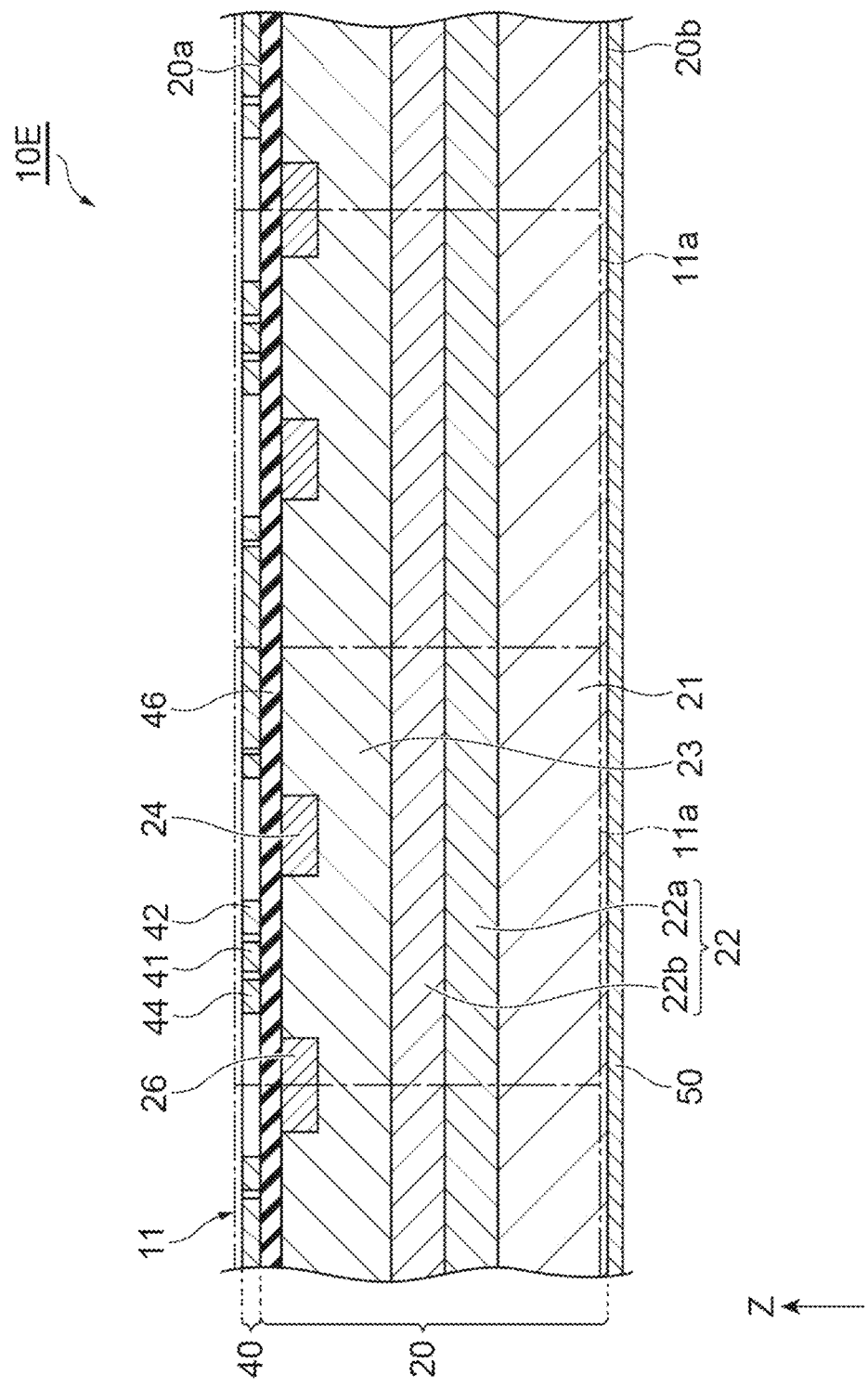
FIG. 15 is a cross-sectional view taken along the line XV-XV shown in FIG. 14.

As shown in FIGS. 14 and 15, a ranging image sensor 10E is mainly different from the above-described ranging image sensor 10A in that the first charge transfer region 24 is arranged in the central portion of each pixel 11a, a plurality of second charge transfer regions 26 are arranged at a plurality of corners of each pixel 11a, the first transfer gate electrode 42 is formed in a ring shape, the photogate electrode 41 is arranged so as to avoid the central portion and the plurality of corners of each pixel 11a, a plurality of second transfer gate electrodes 44 are arranged at a plurality of corners of each pixel 11a, and the trench 29 is not formed in the semiconductor layer 20 and the avalanche multiplication region 22 is continuous over a plurality of pixels 11a.

In each pixel 11a of the ranging image sensor 10E, the first charge transfer region 24 is arranged in the central portion of each pixel 11a when viewed from the Z direction. The plurality of second charge transfer regions 26 are arranged at the plurality of corners of each pixel 11a when viewed from the Z direction. The photogate electrode 41 is arranged so as to avoid the central portion and the plurality of corners of each pixel 11a (that is, avoid the first charge transfer region 24 and the plurality of second charge transfer regions 26). The photogate electrode 41 is continuous over the plurality of pixels 11a. The first transfer gate electrode 42 has, for example, a rectangular ring shape and is arranged outside the first charge transfer region 24 and inside the photogate electrode 41 when viewed from the Z direction. Each second transfer gate electrode 44 is arranged between the photogate electrode 41 and each second charge transfer region 26 when viewed from the Z direction.

In each pixel 11a of the ranging image sensor 10E, the corresponding second charge transfer region 26 and second transfer gate electrode 44 are shared by four adjacent pixels 11a. For this reason, the trench 29 is not formed in the semiconductor layer 20, and the avalanche multiplication region 22 is continuous over the plurality of pixels 11a.

In the ranging image sensor 10E, the avalanche multiplication region 22 formed in the semiconductor layer 20 is continuous over the plurality of pixels 11a. As a result, high sensitivity is realized in each pixel 11a in a state in which the variation in the light receiving sensitivity between the plurality of pixels 11a and the variation in the light receiving sensitivity according to the location in one pixel 11a are suppressed. Therefore, according to the ranging image sensor 10E, it is possible to improve the light receiving sensitivity uniformly in a plurality of pixels 11a.

In addition, in the ranging image sensor 10E, the well region 31, the LOCOS region 33, the barrier region 34, and the sink region 35 (see FIG. 3) are not formed in the semiconductor layer 20. Therefore, according to the ranging image sensor 10E, it is possible to increase the density of the plurality of pixels 11a and simplify the structure of the semiconductor layer 20. As an example, a semiconductor substrate on which a read circuit for each pixel 11a and a CMOS read circuit unit 12 are formed is bonded to the ranging image sensor 10E from the first side.

Modification Examples

The present disclosure is not limited to the first to fifth embodiments described above. In the ranging image sensors 10A, 10B, and 10C, the bottom surface 29a of the trench 29 may be located in the avalanche multiplication region 22. In this case, it is possible to sufficiently suppress the occurrence of crosstalk between adjacent pixels 11a while shortening the time for forming the trench 29.

In the ranging image sensors 10A, 10B, and 10C, the bottom surface 29a of the trench 29 may be located on the first side with respect to the avalanche multiplication region 22, and the avalanche multiplication region 22 may be continuous over the plurality of pixels 11a. Alternatively, in the ranging image sensors 10A and 10B, the trench 29 may not be formed in the semiconductor layer 20, and the avalanche multiplication region 22 may be continuous over the plurality of pixels 11a. Even in these cases, it is possible to improve the light receiving sensitivity uniformly in a plurality of pixels 11a.

In the ranging image sensors 10A and 10B, each sink region 35 does not have to be connected to each of the second charge transfer regions 26 and 27. In the ranging image sensors 10A and 10B, the sink region 35 may not be formed in the semiconductor layer 20. In the ranging image sensors 10A and 10B, the well region 31 and the barrier region 34 may not be formed in the semiconductor layer 20. In the ranging image sensors 10A, 10B, and 10C, the charge blocking region 28 may not be formed in the semiconductor layer 20.

In the ranging image sensor 10D, the sink region 35 connected to the barrier region 34 may be formed in the semiconductor layer 20. In the ranging image sensor 10D, the sink region 35 connected to each of the barrier region 34 and the second charge transfer region 26 may be formed in the semiconductor layer 20. In the ranging image sensor 10D, the well region 31 and the barrier region 34 may not be formed in the semiconductor layer 20. In the ranging image sensors 10D and 10E, the charge blocking region 28 may be formed in the semiconductor layer 20.

As shown in FIGS. 16 to 22, in the ranging image sensors 10A to 10E, an embedded region 36 may be formed in the semiconductor layer 20 of each pixel 11a. The embedded region 36 formed in the semiconductor layer 20 of each pixel 11a suppresses the generation of dark current in each pixel 11a.

Figure 16:
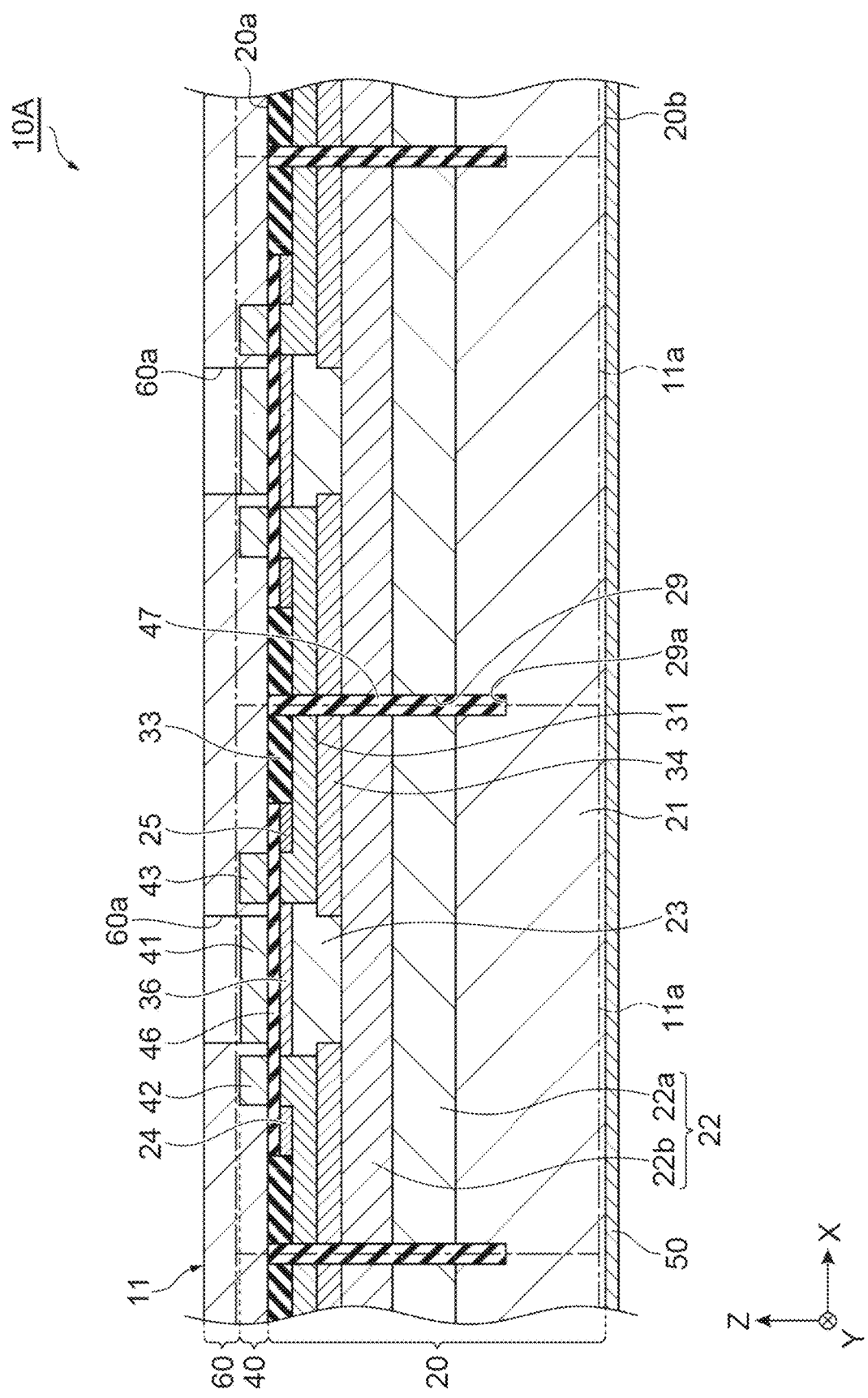
FIG. 16 is a cross-sectional view of a ranging image sensor of a modification example.
Figure 17:
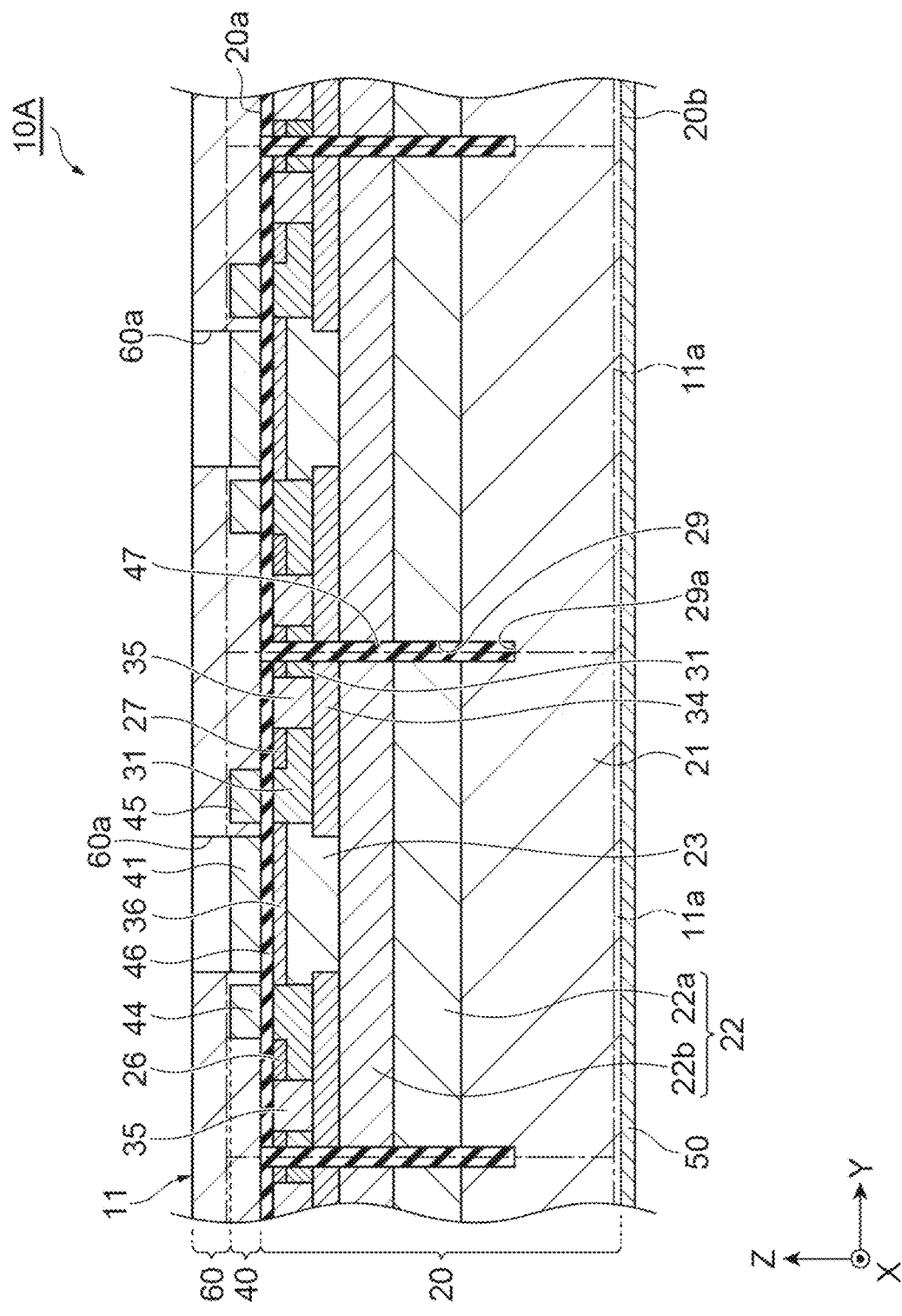
FIG. 17 is a cross-sectional view of a ranging image sensor of a modification example.

The ranging image sensor 10A shown in FIGS. 16 and 17 is mainly different from the above-described ranging image sensor 10A in that a plurality of charge blocking regions 28 are not formed in the semiconductor layer 20 of each pixel 11a and the embedded region 36 is formed in the semiconductor layer 20 of each pixel 11a. The configuration of the semiconductor layer 20 of each pixel 11a in the ranging image sensor 10A shown in FIGS. 16 and 17 is as follows.

As shown in FIGS. 16 and 17, the charge distribution region 23 is formed so as to overlap the photogate electrode 41 when viewed from the Z direction and so as not to overlap a plurality of transfer gate electrodes 42, 43, 44, and 45 when viewed from the Z direction. The embedded region 36 is a p-type region, and is formed on the first side of the charge distribution region 23 in the semiconductor layer 20. That is, the charge distribution region 23 is embedded in the semiconductor layer 20 by the embedded region 36. The well region 31 surrounds a portion of the charge distribution region 23 on the first side and the embedded region 36. A part of the well region 31 is located between the embedded region 36 and each of the charge transfer regions 24, 25, 26, and 27. The barrier region 34 surrounds a portion of the charge distribution region 23 on the second side. When viewed from the Z direction, the inner edge of the barrier region 34 surrounding the charge distribution region 23 is located further inward than the inner edge of the well region 31 surrounding the charge distribution region 23 and the embedded region 36.

Figure 18:
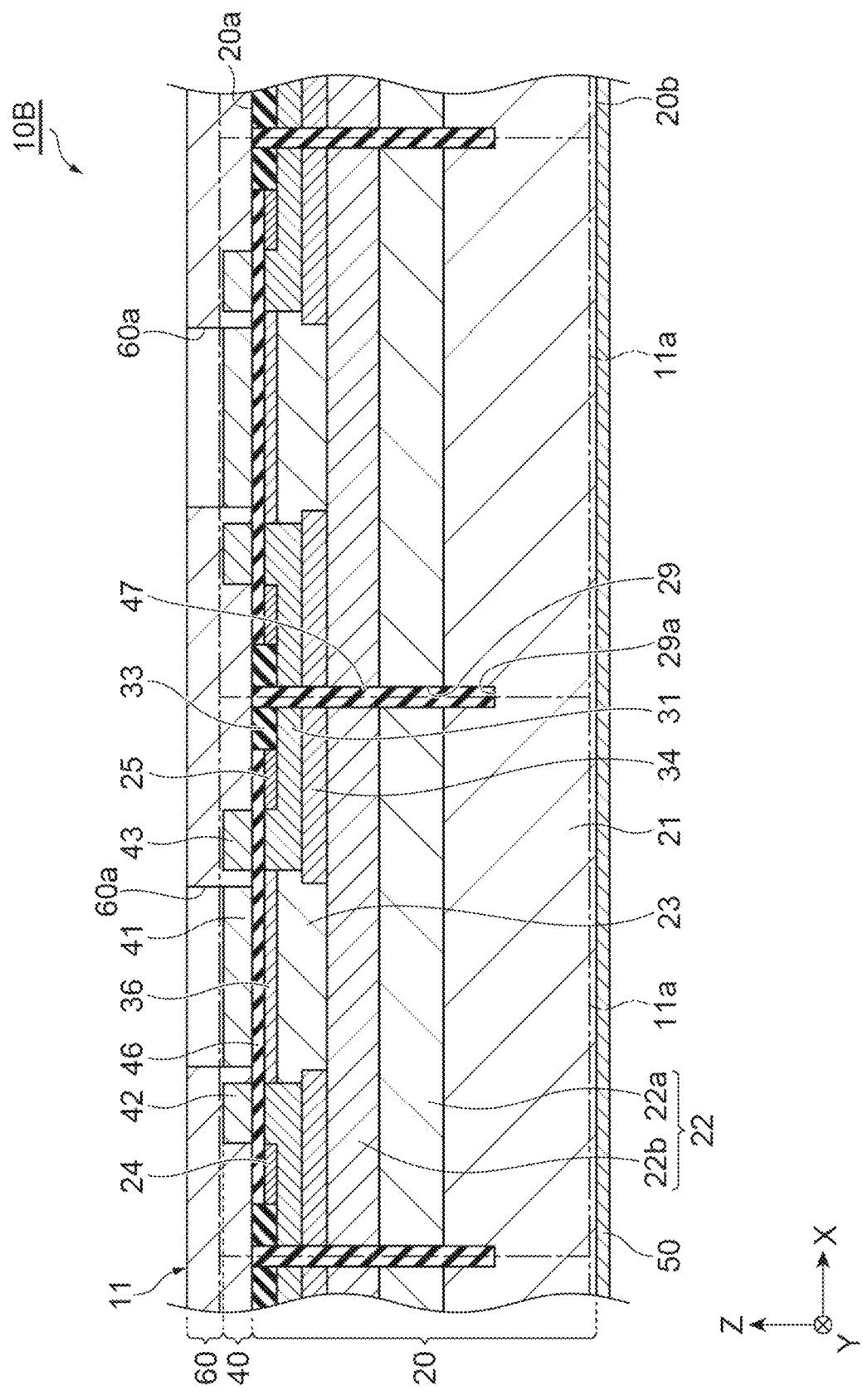
FIG. 18 is a cross-sectional view of a ranging image sensor of a modification example.

The ranging image sensor 10B shown in FIG. 18 is mainly different from the above-described ranging image sensor 10B in that a plurality of charge blocking regions 28 are not formed in the semiconductor layer 20 of each pixel 11a and the embedded region 36 is formed in the semiconductor layer 20 of each pixel 11a. The configuration of the semiconductor layer 20 of each pixel 11a in the ranging image sensor 10B shown in FIG. 18 is as follows.

As shown in FIG. 18, the charge distribution region 23 is formed so as to overlap the photogate electrode 41 when viewed from the Z direction and so as not to overlap a plurality of transfer gate electrodes 42, 43, 44a, 44b, 45a, and 45b (see FIG. 7) when viewed from the Z direction. The embedded region 36 is a p-type region, and is formed on the first side of the charge distribution region 23 in the semiconductor layer 20. That is, the charge distribution region 23 is embedded in the semiconductor layer 20 by the embedded region 36. The well region 31 surrounds a portion of the charge distribution region 23 on the first side and the embedded region 36. A part of the well region 31 is located between the embedded region 36 and each of the charge transfer regions 24, 25, 26a, 26b, 27a, and 27b (see FIG. 7). The barrier region 34 surrounds a portion of the charge distribution region 23 on the second side. When viewed from the Z direction, the inner edge of the barrier region 34 surrounding the charge distribution region 23 is located further inward than the inner edge of the well region 31 surrounding the charge distribution region 23 and the embedded region 36.

Figure 19:
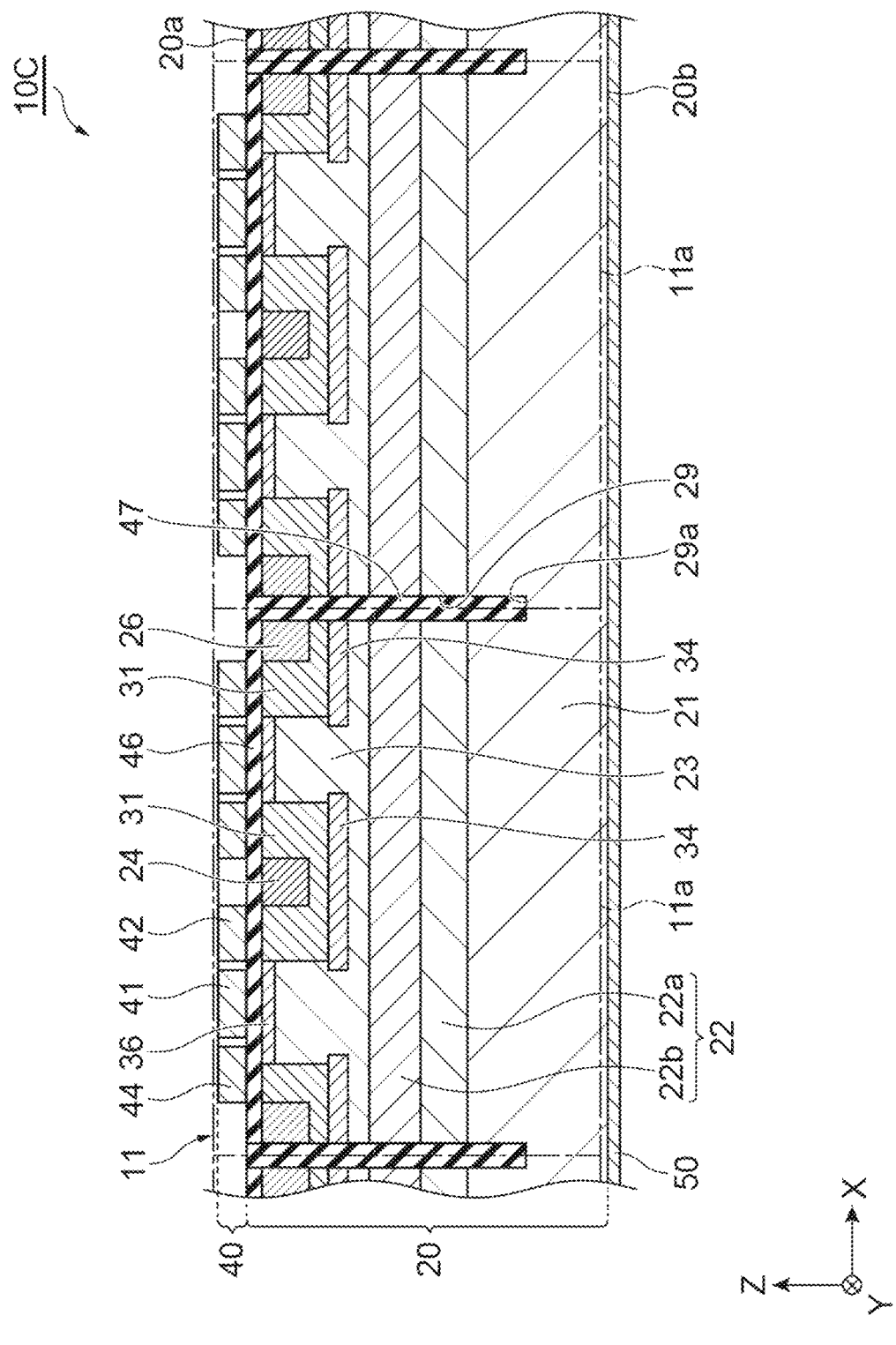
FIG. 19 is a cross-sectional view of a ranging image sensor of a modification example.

The ranging image sensor 10C shown in FIG. 19 is mainly different from the above-described ranging image sensor 10C in that the embedded region 36 is formed in the semiconductor layer 20 of each pixel 11a, the well region 31 (hereinafter, referred to as an "inner well region 31") is formed in the semiconductor layer 20 so as to include the first charge transfer region 24 in each pixel 11a, the well region 31 (hereinafter, referred to as an "outer well region 31") is formed in the semiconductor layer 20 so as to include the second charge transfer region 26 in each pixel 11a, and the barrier region 34 is formed on the second side of each of the inner well region 31 and the outer well region 31. The configuration of the semiconductor layer 20 of each pixel 11a in the ranging image sensor 10C shown in FIG. 19 is as follows.

As shown in FIG. 19, a portion of the charge distribution region 23 on the first side is formed so as to overlap the photogate electrode 41 when viewed from the Z direction and so as not to overlap a plurality of transfer gate electrodes 42 and 44 when viewed from the Z direction. The embedded region 36 is a p-type region, and is formed on the first side of the charge distribution region 23 in the semiconductor layer 20. That is, the charge distribution region 23 is embedded in the semiconductor layer 20 by the embedded region 36. The embedded region 36 has, for example, a rectangular ring shape when viewed from the Z direction, similarly to the photogate electrode 41. The embedded region 36 surrounds the inner well region 31 when viewed from the Z direction. The outer well region 31 surrounds the embedded region 36 when viewed from the Z direction.

Figure 20:
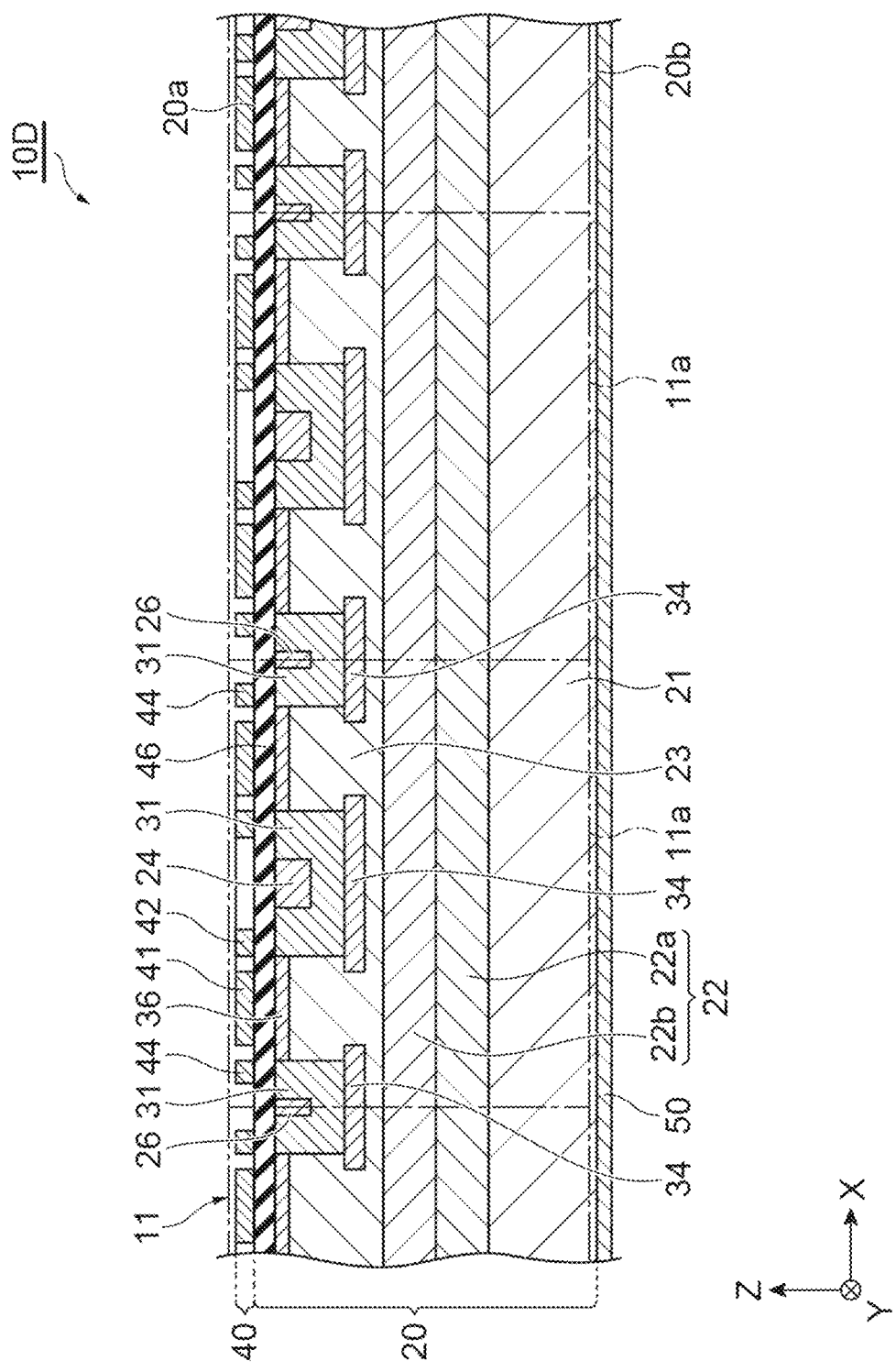
FIG. 20 is a cross-sectional view of a ranging image sensor of a modification example.
Figure 21:
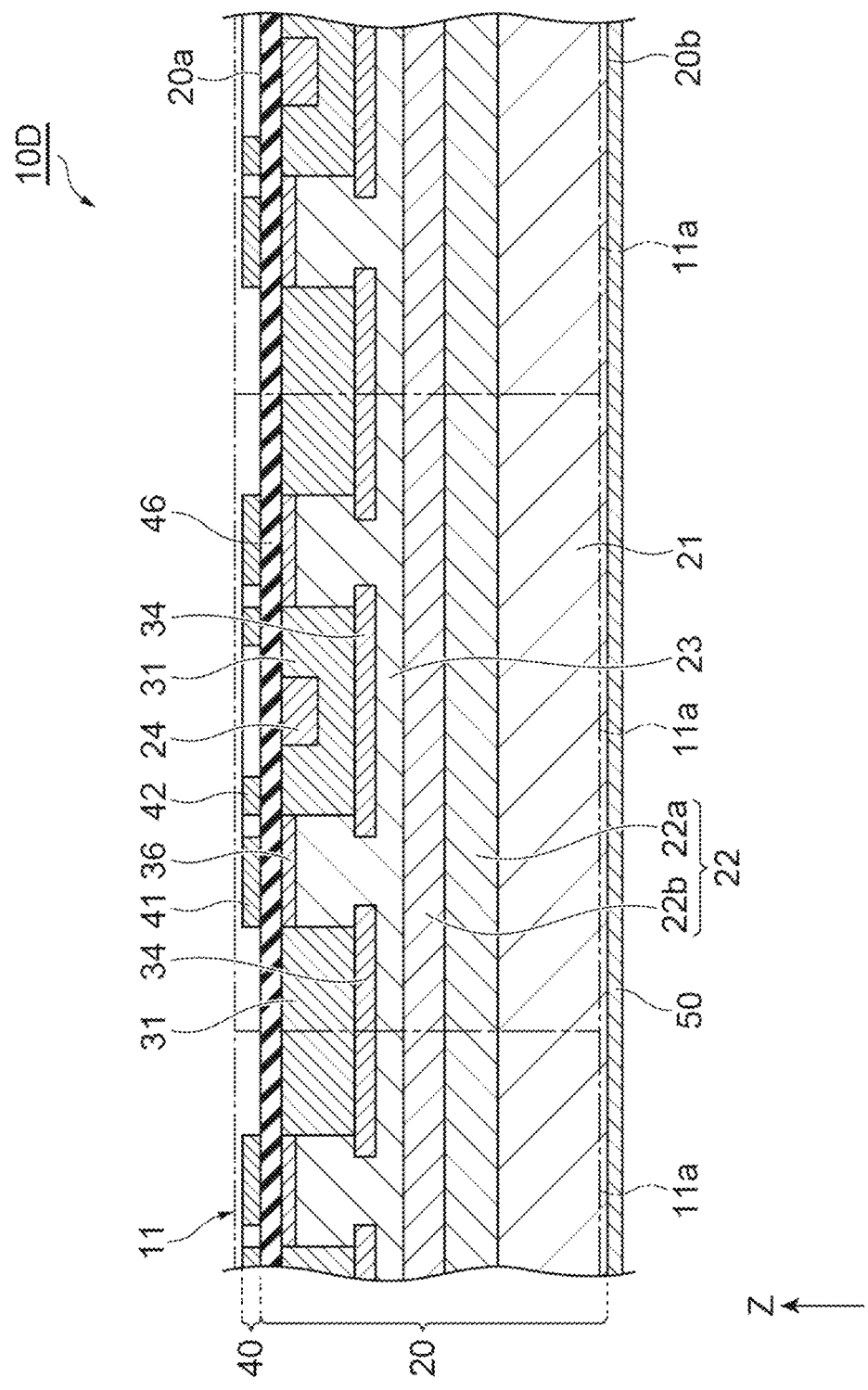
FIG. 21 is a cross-sectional view of a ranging image sensor of a modification example.

The ranging image sensor 10D shown in FIGS. 20 and 21 is mainly different from the above-described ranging image sensor 10D in that the embedded region 36 is formed in the semiconductor layer 20 of each pixel 11a, the well region 31 (hereinafter, referred to as an "inner well region 31") is formed in the semiconductor layer 20 so as to include the first charge transfer region 24 in each pixel 11a, the well region 31 (hereinafter, referred to as an "outer well region 31") is formed in the semiconductor layer 20 so as to include a plurality of second charge transfer regions 26 in each pixel 11a, and the barrier region 34 is formed on the second side of each of the inner well region and the outer well region 31. The configuration of the semiconductor layer 20 of each pixel 11a in the ranging image sensor 10D shown in FIGS. 20 and 21 is as follows.

As shown in FIGS. 20 and 21, a portion of the charge distribution region 23 on the first side is formed so as to overlap the photogate electrode 41 when viewed from the Z direction and so as not to overlap a plurality of transfer gate electrodes 42 and 44 when viewed from the Z direction. The embedded region 36 is a p-type region, and is formed on the first side of the charge distribution region 23 in the semiconductor layer 20. That is, the charge distribution region 23 is embedded in the semiconductor layer 20 by the embedded region 36. The embedded region 36 has, for example, a rectangular ring shape when viewed from the Z direction, similarly to the photogate electrode 41. The embedded region 36 surrounds the inner well region 31 when viewed from the Z direction. The outer well region 31 surrounds the embedded region 36 when viewed from the Z direction.

Figure 22:
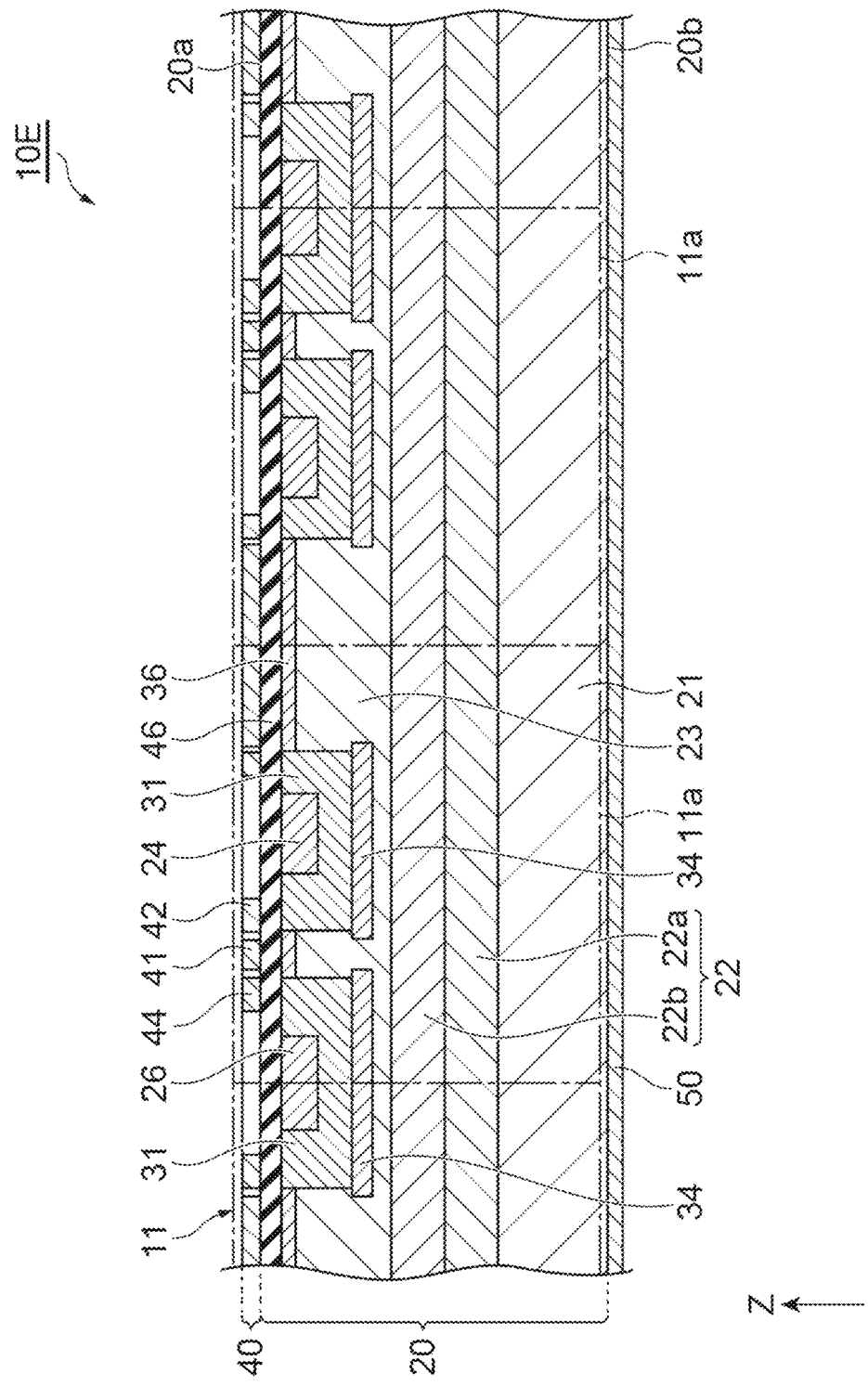
FIG. 22 is a cross-sectional view of a ranging image sensor of a modification example.

The ranging image sensor 10E shown in FIG. 22 is mainly different from the above-described ranging image sensor 10E in that the embedded region 36 is formed in the semiconductor layer 20 of each pixel 11a, the well region 31 (hereinafter, referred to as an "inner well region 31") is formed in the semiconductor layer 20 so as to include the first charge transfer region 24 in each pixel 11a, the well region 31 (hereinafter, referred to as an "outer well region 31") is formed in the semiconductor layer 20 so as to include each of the plurality of second charge transfer regions 26 in each pixel 11a, and the barrier region 34 is formed on the second side of each of the inner well region 31 and the outer well region 31. The configuration of the semiconductor layer 20 of each pixel 11a in the ranging image sensor 10E shown in FIG. 22 is as follows.

As shown in FIG. 22, a portion of the charge distribution region 23 on the first side is formed so as to overlap the photogate electrode 41 when viewed from the Z direction and so as not to overlap a plurality of transfer gate electrodes 42 and 44 when viewed from the Z direction. The embedded region 36 is a p-type region, and is formed on the first side of the charge distribution region 23 in the semiconductor layer 20. That is, the charge distribution region 23 is embedded in the semiconductor layer 20 by the embedded region 36. The embedded region 36 surrounds the inner well region 31 when viewed from the Z direction.

In the ranging image sensors 10A to 10E, it is possible to make light incident on the semiconductor layer 20 from both the first side and the second side. For example, when light is incident on the semiconductor layer 20 from the second side, the counter electrode 50 may be formed of a material having conductivity and light transmission (for example, polysilicon). The electrode (electrode on the first conductive type side) connected to the first multiplication region 22a side, such as an electrode connected to the semiconductor region 21, is not limited to the counter electrode 50, and may be a through electrode extending from the first surface 20a of the semiconductor layer 20 to the semiconductor region 21, an electrode formed on the surface of the semiconductor region 21 reaching the first surface 20a of the semiconductor layer 20, and the like. In any of the ranging image sensors 10A to 10E, at least one first charge transfer region, at least one second charge transfer region, at least one first transfer gate electrode, and at least one second transfer gate electrode may be provided for one pixel 11a, and the method of applying a voltage to the first transfer gate electrode and the second transfer gate electrode and the method of extracting and discharging the charge from the first charge transfer region and the second charge transfer region are not limited to those described above. In any of the ranging image sensors 10A to 10E, each of the conductive types of p-type and n-type may be reversed from those described above. In any of the ranging image sensors 10A to 10E, the plurality of pixels 11a may be aligned in a one-dimensional manner along the first surface 20a of the semiconductor layer 20.

REFERENCE SIGNS LIST 10A, 10B, 10C, 10D, 10E: ranging image sensor, 11a: pixel, 20: semiconductor layer, 20a: first surface, 20b: second surface, 20s: semiconductor substrate, 22: avalanche multiplication region, 22a: first multiplication region, 22b: second multiplication region, 23: charge distribution region, 24, 25: first charge transfer region, 26, 26a, 26b, 27, 27a, 27b: second charge transfer region, 29: trench, 29a: bottom surface, 31: well region, 34: barrier region, 35: sink region, 40: electrode layer, 41: photogate electrode, 42, 43: first transfer gate electrode, 44, 44a, 44b, 45, 45a, 45b: second transfer gate electrode, 60: wiring layer.

The invention claimed is:

1. A ranging image sensor, comprising:
a semiconductor layer having a first surface on a first side and a second surface on a second side opposite to the first side and forming a plurality of pixels arranged along the first surface; and
an electrode layer provided on the first surface and forms the plurality of pixels,
wherein each of the plurality of pixels includes:
an avalanche multiplication region including a first conductive type first multiplication region formed in the semiconductor layer and a second conductive type second multiplication region formed on the first side of the first multiplication region in the semiconductor layer;
a second conductive type charge distribution region formed on the first side of the second multiplication region in the semiconductor layer and connected to the second multiplication region;
a second conductive type first charge transfer region formed on the first side of the second multiplication region in the semiconductor layer and connected to the charge distribution region;
a second conductive type second charge transfer region formed on the first side of the second multiplication region in the semiconductor layer and connected to the charge distribution region;
a photogate electrode formed on the first side of the charge distribution region in the electrode layer;
a first transfer gate electrode formed on the first side of the charge distribution region in the electrode layer so as to be located on the first charge transfer region side with respect to the photogate electrode; and
a second transfer gate electrode formed on the first side of the charge distribution region in the electrode layer so as to be located on the second charge transfer region side with respect to the photogate electrode, and the avalanche multiplication region is continuous over the plurality of pixels or reaches a trench formed in the semiconductor layer so as to separate the plurality of pixels from each other.

2. The ranging image sensor according to claim 1, wherein the trench is formed on the first surface, and
a bottom surface of the trench is located on the second side with respect to the avalanche multiplication region.

3. The ranging image sensor according to claim 1, wherein the trench is formed on the first surface, and
a bottom surface of the trench is located in the avalanche multiplication region.

4. The ranging image sensor according to claim 1, wherein each of the plurality of pixels further includes:
a first conductive type well region formed on the first side of the second multiplication region in the semiconductor layer and forming a read circuit electrically connected to at least one of the first charge transfer region and the second charge transfer region; and
a second conductive type barrier region formed between the second multiplication region and the well region in the semiconductor layer.

5. The ranging image sensor according to claim 4, wherein the barrier region includes the well region when viewed from a thickness direction of the semiconductor layer.

6. The ranging image sensor according to claim 4, wherein each of the plurality of pixels further includes a second conductive type sink region formed on the first side of the barrier region in the semiconductor layer and connected to the barrier region.

7. The ranging image sensor according to claim 6, wherein the sink region is connected to the second charge transfer region.

8. The ranging image sensor according to claim 1, further comprising:
a wiring layer provided on the first surface so as to cover the electrode layer and electrically connected to each of the plurality of pixels.

9. A method for manufacturing the ranging image sensor according to claim 1, comprising:
a first step of forming the semiconductor layer by forming the avalanche multiplication region, the charge distribution region, the first charge transfer region, and the second charge transfer region on a semiconductor substrate; and
a second step of forming the electrode layer by forming the photogate electrode, the first transfer gate electrode, and the second transfer gate electrode on the first surface of the semiconductor layer after the first step,
wherein, in the first step, the avalanche multiplication region is formed on the semiconductor substrate so as to be continuous over the plurality of pixels.

10. The method for manufacturing the ranging image sensor according to claim 9,
wherein, in the first step, the trench is formed on the first surface after at least the avalanche multiplication region is formed on the semiconductor substrate.

11. The method for manufacturing the ranging image sensor according to claim 10, further comprising:
a third step of forming a wiring layer on the first surface so as to cover the electrode layer and electrically connecting the wiring layer to each of the plurality of pixels after the second step.

* * * * *